(12) United States Patent
Saio et al.

(10) Patent No.: US 9,496,131 B2
(45) Date of Patent: Nov. 15, 2016

(54) LIQUID CHEMICAL FOR FORMING PROTECTING FILM

(71) Applicant: Central Glass Company, Limited, Ube-shi, Yamaguchi (JP)

(72) Inventors: Takashi Saio, Suzuka (JP); Soichi Kumon, Matsusaka (JP); Masanori Saito, Matsusaka (JP); Shinobu Arata, Matsusaka (JP); Hidehisa Nanai, Tokyo (JP); Yoshinori Akamatsu, Matsusaka (JP)

(73) Assignee: Central Glass Company, Limited, Ube-shi (JP)

( * ) Notice: Subject to any disclaimer, the term of this patent is extended or adjusted under 35 U.S.C. 154(b) by 103 days.

(21) Appl. No.: 14/478,466

(22) Filed: Sep. 5, 2014

(65) Prior Publication Data

US 2014/0373870 A1    Dec. 25, 2014

Related U.S. Application Data

(62) Division of application No. 13/348,268, filed on Jan. 11, 2012, now Pat. No. 8,932,390.

(60) Provisional application No. 61/487,924, filed on May 19, 2011, provisional application No. 61/444,345, filed on Feb. 18, 2011.

(30) Foreign Application Priority Data

| Jan. 12, 2011 | (JP) | 2011-003519 |
| Apr. 1, 2011 | (JP) | 2011-082106 |
| Apr. 21, 2011 | (JP) | 2011-094726 |
| Oct. 17, 2011 | (JP) | 2011-228200 |
| Dec. 15, 2011 | (JP) | 2011-275051 |

(51) Int. Cl.
*H01L 21/02* (2006.01)
*C11D 11/00* (2006.01)

(52) U.S. Cl.
CPC ..... *H01L 21/02068* (2013.01); *C11D 11/0047* (2013.01)

(58) Field of Classification Search
CPC .................................... C11D 11/0047
See application file for complete search history.

(56) References Cited

U.S. PATENT DOCUMENTS

| 7,491,286 B2 | 2/2009 | Kagan et al. |
| 2004/0163758 A1 | 8/2004 | Kagan et al. |

(Continued)

FOREIGN PATENT DOCUMENTS

| CN | 101191229 A | 6/2008 |
| JP | 5-299336 A | 11/1993 |

(Continued)

OTHER PUBLICATIONS

Japanese Office Action issued in counterpart Japanese Application No. 2011-275051 dated Dec. 1, 2015 (five (5) pages).

(Continued)

*Primary Examiner* — Gregory Webb
(74) *Attorney, Agent, or Firm* — Crowell & Moring LLP

(57) ABSTRACT

Disclosed is a liquid chemical for forming a water-repellent protecting film. The liquid chemical contains an agent for forming a water-repellent protecting film, and a solvent. The agent is for provided to form a water-repellent protecting film on a wafer after a cleaning step for the wafer and before a drying step for the wafer, the wafer having at its surface an uneven pattern and containing at least one kind element of titanium, tungsten, aluminum, copper, tin, tantalum and ruthenium at surfaces of recessed portions of the uneven pattern, the water-repellent protecting film being formed at least on the surfaces of the recessed portions. The liquid chemical is characterized in that the agent for forming a water-repellent protecting film is a compound represented by the following general formula [1].

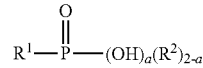

[1]

21 Claims, 2 Drawing Sheets

(56) References Cited

U.S. PATENT DOCUMENTS

| | | |
|---|---|---|
| 2004/0259357 A1 | 12/2004 | Saga |
| 2004/0265571 A1 | 12/2004 | Schwartz et al. |
| 2007/0092673 A1 | 4/2007 | Bruner et al. |
| 2007/0212808 A1 | 9/2007 | Nie et al. |
| 2008/0075885 A1 | 3/2008 | Nie et al. |
| 2008/0261025 A1 | 10/2008 | Abys et al. |
| 2008/0283228 A1 | 11/2008 | Ohwaki et al. |
| 2010/0240219 A1 | 9/2010 | Tomita et al. |
| 2011/0132397 A1* | 6/2011 | Kumon ............ H01L 21/02052 134/6 |
| 2011/0162680 A1* | 7/2011 | Saito ..................... C11D 1/002 134/26 |
| 2011/0214685 A1* | 9/2011 | Kumon ..................... B08B 3/00 134/1 |

FOREIGN PATENT DOCUMENTS

| | | |
|---|---|---|
| JP | 2003-224099 A | 8/2003 |
| JP | 2007-173601 A | 7/2007 |
| JP | 2008-198958 A | 8/2008 |
| JP | 2009-512905 A | 3/2009 |
| JP | 2010-114414 A | 5/2010 |
| JP | 2010-129932 A | 6/2010 |
| JP | 2010-525169 A | 7/2010 |
| JP | 2010-192878 A | 9/2010 |
| JP | 2010-192879 A | 9/2010 |
| JP | 2010-272852 A | 12/2010 |
| WO | WO 2010/047196 A1 | 4/2010 |
| WO | WO 2012/027667 A3 | 3/2012 |

OTHER PUBLICATIONS

Korean Office Action dated Aug. 14, 2014 (Four (4) pages).
JIS R 3257, 1999 (Sixteen (16) pages).
JIS B 0601, 2003 (Sixteen (16) pages).
Corresponding International Search Report with English Translation dated Apr. 4, 2012 (five (5) pages).
PCT forms ISA/210 and ISA 237 dated Apr. 3, 2012 (five (5) pages).
Taiwanese Office Action dated Mar. 4, 2014 (6 pages).
Archanjo, B.S., et al., "Nanowires and Nanoribbons Forms by Methylphosphonic Acid", Journal of Nanoscience and Nanotechnology, vol. 7, pp. 1-10, American Scientific Publishers, 2007.
Japanese-language Office Action issued in counterpart Japanese Application No. 2012-079211 dated Jun. 21, 2016 (two (2) pages).

* cited by examiner

LIQUID CHEMICAL FOR FORMING PROTECTING FILM

CROSS REFERENCE TO RELATED APPLICATIONS

This application is a divisional U.S. patent application Ser. No. 13/348,268, filed Jan. 11, 2012, which claims benefit of U.S. provisional patent Application No. 61/487,924, filed May 19, 2011 and U.S. provisional patent Application No. 61/444,345, filed Feb. 18, 2011, and which claims priority under 35 U.S.C. §119 from Japanese patent Application No. 2011-003519, filed Jan. 12, 2011, Japanese patent Application No. 2011-275051, filed Dec. 15, 2011, Japanese patent Application No. 2011-228200, filed Oct. 17, 2011, Japanese patent Application No. 2011-094726, filed Apr. 21, 2011 and Japanese patent Application No. 2011-082106, filed Apr. 1, 2011, the entire disclosures of which are expressly incorporated by reference herein.

BACKGROUND OF THE INVENTION

The present invention relates to a technique of cleaning a substrate (a wafer) in semiconductor device fabrication or the like.

Semiconductor devices for use in networks or digital household electric appliances are desired to be further sophisticated and multifunctional, and to be low in power consumption. Accordingly, the trend toward micro-patterning for circuits is continuing. Together with the continuation of micro-patterning, a pattern collapse in the circuits has become a significant problem. In semiconductor device fabrication, a cleaning step is greatly used for the purpose of removing particles and metal impurities. As a result of this, the cleaning step occupies 30-40% of the whole of the semiconductor fabrication step. A phenomenon observed in the cleaning step when an aspect ratio of pattern is high due to the micro-patterning for semiconductor device is a pattern collapse, in which a gas-liquid interface that comes about collapses the pattern at the time of passing therethrough and at the time of drying the wafer after cleaning or rinsing.

In Patent Publication 1, there is disclosed a method of suppressing the pattern collapse, i.e., a technique of changing a cleaning liquid from water to 2-propanol before the gas-liquid interface passes through a pattern. However, this is said to have some constraints, for example, in that an adaptable aspect ratio of pattern is not higher than 5.

Additionally, Patent Publication 2 discloses a technique directed toward a resist pattern as a method of suppressing the pattern collapse. This is a method of decreasing a capillary force as far as possible thereby suppressing the pattern collapse.

However, the thus disclosed technique is directed toward the resist pattern and is for reforming a resist itself. Moreover, it can finally be removed together with the resist so as not to need to estimate a process of removing a treatment agent after drying. Therefore, this cannot be applied to the objects of the present invention.

Additionally, there is set forth in Patent Publication 3 a cleaning process for: conducting surface-reforming of a wafer surface formed having an uneven pattern with a film containing silicon, by oxidation or the like; forming a water-repellent protecting film on the surface by using a water-soluble surfactant or a silane coupling agent; reducing the capillary force; and preventing the pattern collapse.

Furthermore, in Patent Publications 4 and 5, there is disclosed a technique for preventing the pattern collapse by conducting a hydrophobicity-imparting treatment in the use of a treatment liquid containing: a silylation agent represented by N,N-dimethylaminotrimethylsilane; and a solvent.

REFERENCES ABOUT PRIOR ART

Patent Publication

Patent Publication 1: Japanese Patent Application Publication No. 2008-198958
Patent Publication 2: Japanese Patent Application Publication No. 5-299336
Patent Publication 3: Japanese Patent No. 4403202
Patent Publication 4: Japanese Patent Application Publication No. 2010-129932
Patent Publication 5: International Application Publication No. 10/47196 Pamphlet

SUMMARY OF THE INVENTION

The present invention relates to a technique for cleaning a substrate (a wafer) in semiconductor device fabrication and the like, the objective of which is to enhance the production yield of devices having such a circuit pattern as to be particularly fine and high in aspect ratio, and more particularly to a water-repellent liquid chemical and the like with the objective of improving a cleaning step which tends to induce a wafer having at its surface an uneven pattern to cause an uneven pattern collapse.

Hitherto, there has generally been used a wafer containing silicon element at its surface; however, a wafer containing at its surface an element such as titanium, tungsten, aluminum, copper, tin, tantalum and ruthenium (hereinafter, they may sometimes be referred to as "metal-based element") has become used together with the diversification of the pattern. However, in a case where a wafer having at its surface a substance that does not sufficiently contain reactive functional groups (e.g., silanol groups), such as the wafer containing the above-mentioned metal-based element at its surface, it is not possible to form a water-repellent protecting film for preventing the pattern collapse even if the treatment liquid or treatment method discussed in Patent Publications 3 to 5 is used, which is a problem in that the pattern collapse cannot be prevented.

Challenges for the present invention are: to form a water-repellent protecting film on a wafer having an uneven pattern at its surface and containing at least one kind element of titanium, tungsten, aluminum, copper, tin, tantalum and ruthenium at surfaces of recessed portions of the uneven pattern (hereinafter, such a wafer sometimes be referred to as "a metal-based wafer" or merely "a wafer"), at least on the surfaces of the recessed portions so as to reduce interaction between a liquid retained in the recessed portions and the surfaces of the recessed portions thereby improving a cleaning step which tends to induce the pattern collapse; and to provide a liquid chemical for forming the protecting film, i.e., a liquid chemical which able to form the water-repellent protecting film.

Means For Solving The Problem

The pattern collapse is to occur when an gas-liquid interface passes through the pattern at the time of drying a wafer after cleaning the wafer with a cleaning liquid. The reason therefor is said that a difference in height of residual liquid of the cleaning liquid between a part having high aspect ratio and a part having low aspect ratio causes a difference in capillary force which acts on the pattern.

Accordingly, it is expected, by decreasing the capillary force, that the difference in capillary force due to the difference in height of residual liquid is reduced thereby resolving the pattern collapse. The magnitude of the capillary force is the absolute value of P obtained by the equation as shown below. It is expected from this equation that the capillary force can be reduced by decreasing γ or cos θ.

$$P=2\times\gamma\times\cos\theta/S$$

(In the equation, γ represents the surface tension of a liquid retained in the recessed portions, θ represents the contact angle of the liquid retained in the recessed portions to the surfaces of the recessed portions, and S represents the width of the recessed portions.)

In the present invention, there is formed a water-repellent protecting film at least on the surfaces of the recessed portions of the uneven pattern when a liquid that remains in the recessed portions after the protecting film has been formed is removed from the recessed portions or dried. Therefore, the capillary force which acts on the recessed portions is so reduced that the pattern collapse becomes difficult to occur. Additionally, the protecting film is to be removed after the drying step.

A liquid chemical for forming a water-repellent protecting film, according to the present invention (hereinafter, the liquid chemical may sometimes be referred to as "a liquid chemical for forming a protecting film" or merely "a liquid chemical") is a liquid chemical including:

an agent for forming a water-repellent protecting film (hereinafter, the agent may sometimes be referred to as merely "a protecting-film-forming agent"), the agent being for forming a water-repellent protecting film (hereinafter, the film may sometimes be referred to as merely "a protecting film") on a wafer after a cleaning step for the wafer and before a drying step for the wafer, the wafer having at its surface an uneven pattern and containing at least one kind element of titanium, tungsten, aluminum, copper, tin, tantalum and ruthenium at surfaces of recessed portions of the uneven pattern, the water-repellent protecting film being formed at least on the surfaces of the recessed portions; and a solvent, the liquid chemical being characterized in that the agent for forming a water-repellent protecting film is a compound represented by the following general formula [1].

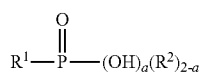

[1]

(In the formula [1], $R^1$ represents a $C_1$-$C_{18}$ monovalent hydrocarbon group the hydrogen elements of which may partially or entirely be replaced with a fluorine element(s). $R^2$ mutually independently represents a monovalent organic group having a $C_1$-$C_{18}$ hydrocarbon group the hydrogen elements of which may partially or entirely be replaced with a fluorine element(s). a is an integer of from 0 to 2.)

By using the protecting-film-forming agent represented by the above-mentioned general formula [1], it becomes possible to form a water-repellent protecting film at least on the surfaces of the recessed portions of the metal-based wafer. In the protecting-film-forming agent, P—OH group and/or P═O group (hereinafter, these may sometimes be referred to as "a functional moiety") have compatibility with a substance containing the metal-based element. Incidentally, "having compatibility" means that Van der Waals force, a static interaction or the like acts between the surface of the substance containing the metal-based element and the functional moiety of the protecting-film-forming agent thereby causing adsorption and/or that the surface of the substance is reacted with the functional moiety of the protecting-film-forming agent to build a chemical bond thereby causing adsorption. Additionally, $R^1$ is a hydrophobic moiety of the protecting-film-forming agent. Therefore, when the protecting-film-forming agent is adsorbed on the metal-based element of the metal-based wafer, hydrophobic moieties are arranged outward from the surface of the wafer thereby imparting repellency to the wafer surface.

Furthermore, it is preferable that the protecting-film-forming agent is a compound represented by the following general formula [2].

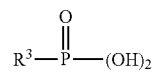

[2]

(In the formula [2], $R^3$ represents a $C_1$-$C_{18}$ monovalent hydrocarbon group the hydrogen elements of which may partially or entirely be replaced with a fluorine element(s).)

As the metal-based wafer, it is possible to cite those containing at least one kind element of titanium, tungsten, aluminum, copper, tin, tantalum and ruthenium at the surfaces of the recessed portions of the uneven pattern, preferably those containing at least one kind element of titanium, tungsten, aluminum and ruthenium, and particularly preferably those containing titanium element. In a case of a wafer containing silicon element at the surfaces of the recessed portions of the uneven pattern, there are a multitude of silanol groups (SiOH groups) on the surfaces. These silanol groups serve as reaction points to be reacted with a silane coupling agent, so that the water-repellent protecting film can easily be formed on the surfaces of the recessed portions. On the other hand, in a case of the metal-based wafer, the surface has fewer reaction points like the silanol groups, so that it is difficult to form the protecting film with a compound such as the silane coupling agent. Additionally, in the present invention, the wafer having at its surface an uneven pattern means a wafer which is in a condition where the uneven pattern has already been formed on the surface by etching, imprint or the like. Moreover, it is possible to adopt a wafer on which another process such as metal routing has been performed, as far as the wafer has an uneven pattern at its surface.

The liquid chemical for forming a protecting film, according to the present invention is used in such a manner as to substitute a cleaning liquid with the liquid chemical during a cleaning step for the metal-based wafer. Additionally, the substituted liquid chemical may be substituted with another cleaning liquid.

Furthermore, a water-repellent protecting film of the present invention is a water-repellent protecting film formed on a wafer after a cleaning step for the wafer and before a drying step for the wafer, the wafer having at its surface an uneven pattern and containing at least one kind element of titanium, tungsten, aluminum, copper, tin, tantalum and ruthenium at surfaces of recessed portions of the uneven pattern, the water-repellent protecting film being formed at least on the surfaces of the recessed portions by retaining the liquid chemical for forming a water-repellent protecting film at least in the recessed portions. The water-repellent protecting film is characterized by being formed of a compound represented by the general formula [1] and serving as an agent for forming a water-repellent protecting film. Incidentally, the water-repellent protecting film of the present invention may be such as to contain a reaction product having as the primary component a compound represented by the general formula [1].

The cleaning liquid is substituted with the liquid chemical for forming a protecting film after the cleaning step, and the liquid chemical is retained at least in the recessed portions of the uneven pattern as discussed above, during which the protecting film is formed at least on the surfaces of the recessed portions of the uneven pattern. The protecting film of the present invention may be not necessarily continuously formed and not necessarily uniformly formed. However, in order to impart more excellent water repellency, it is preferable to form the protecting film continuously and uniformly.

In the present invention, the protecting film means a film formed on the wafer surface so as to reduce the wettability of the wafer surface, i.e., a film imparting water repellency to the same. In the present invention, the water repellency means to decrease a surface energy of a surface of an article thereby weakening the interaction between water or another liquid and the surface of the article (i.e., at the interface), such as a hydrogen bond, intermolecular forces and the like. The effect of reducing the interaction is particularly exhibited with water, but the effect of reducing the interaction is exhibited also with a mixture liquid of water and a liquid other than water or with a liquid other than water. With such a reduction of the interaction, the contact angle of the liquid to the article surface can be increased.

Furthermore, a method for cleaning a wafer, according to the present invention is a method for cleaning a wafer having at its surface an uneven pattern and containing at least one kind element of titanium, tungsten, aluminum, copper, tin, tantalum and ruthenium at surfaces of recessed portions of the uneven pattern. The method including at least:

a protecting-film-forming step where a liquid chemical for forming a protecting film is retained at least in the recessed portions of the uneven pattern;

a drying step of removing liquid from the uneven pattern by drying; and a film-removing step of removing the protecting film, wherein the liquid chemical for forming a protecting film is a liquid chemical containing an agent for forming a water-repellent protecting film, the agent being for forming a water-repellent protecting film at least on the surfaces of the recessed portions, the cleaning method being characterized in that the water-repellent protecting film is formed of a compound represented by the general formula [1] and serving as an agent for forming a water-repellent protecting film.

Effects of the Invention

The protecting film formed from the liquid chemical for forming a protecting film, according to the present invention is excellent in water repellency. Therefore, in a wafer having at its surface an uneven pattern and containing at least one kind element of titanium, tungsten, aluminum, copper, tin, tantalum and ruthenium at surfaces of recessed portions of the uneven pattern, the film reduces the interaction between liquid retained in the recessed portions and the surfaces of the recessed portions, and by extension brings about the effect of preventing the pattern collapse. By using the liquid chemical, a cleaning step conducted in a method for producing the wafer having at its surface an uneven pattern is improved without lowering throughput. Accordingly, the method for producing the wafer having the uneven pattern at its surface, conducted in the use of the liquid chemical for forming a protecting film of the present invention, is excellent in productivity.

The liquid chemical for forming a protecting film, according to the present invention is adaptable to uneven patterns having the aspect ratio expected to rise more and more, for example, an aspect ratio of not less than 7, which allows cost reduction in producing more sophisticated semiconductor devices. In addition, the liquid chemical is adaptable without considerably modifying conventional apparatuses and therefore results in being one applicable in production of various kinds of semiconductor devices.

DETAILED DESCRIPTION

Figure 1:
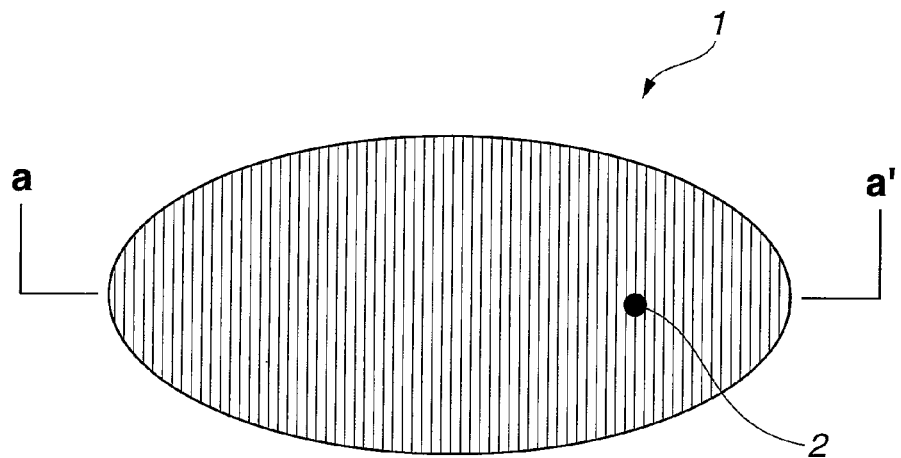
FIG. 1 is a schematic perspective view of a wafer 1 of which surface is made into a surface having an uneven pattern 2.

As the metal-based wafer, it is possible to cite: those obtained by coating a surface of a silicon wafer, a wafer formed of a plurality of components including silicon and/or silicon oxide ($SiO_2$), a silicon carbide wafer, a sapphire wafer, various compound semiconductor wafers, a plastic wafer or the like with a layer formed of a matter containing titanium element such as titanium, titanium nitride, titanium oxide and the like, a matter containing tungsten element such as tungsten, tungsten oxide and the like, a matter containing aluminum element such as aluminum and aluminum oxide and the like; a matter containing copper element such as copper and copper oxide and the like, a matter containing tin element such as tin and tin oxide and the like, a matter containing tantalum element such as tantalum nitride and tantalum oxide and the like or a matter containing ruthenium element such as ruthenium and ruthenium oxide and the like; those in which at least one layer of a multilayer film formed on the wafer is the layer formed of a matter containing the above-mentioned metal-based elements. The step of forming the uneven pattern is conducted on a layer including a layer of a matter containing the above-mentioned metal-based elements. Additionally, there are also included those in which at least a part of the surfaces having the uneven pattern becomes a matter containing at least one kind element of the above-mentioned metal-based elements at the time of forming the uneven pattern.

In general, a surface treatment using a liquid chemical for forming a protecting film of the present invention mostly undergoes, before it is conducted, the following pretreatment steps as exemplified by:

a pretreatment step 1 of making a wafer surface into a surface having an uneven pattern;

a pretreatment step 2 of cleaning the wafer surface by using a water-based cleaning liquid; and a pretreatment step 3 of substituting the water-based cleaning liquid with a cleaning liquid A different from the water-based cleaning liquid (hereinafter it may sometimes be referred to as merely "a cleaning liquid A").

Incidentally, either the pretreatment step 2 or the pretreatment step 3 may be omitted in some cases.

In the pretreatment step 1 as a pattern-forming method, a resist is applied to the wafer surface first of all. Thereafter, the resist is exposed through a resist mask, followed by conducting an etching removal on the exposed resist or an unexposed resist, thereby producing a resist having a desired uneven pattern. Additionally, the resist having an uneven pattern can be obtained also by pushing a mold having a pattern onto the resist. Then, the wafer is subjected to etching. At this time, the parts of the wafer surface which corresponding to recessed portions of a resist pattern are etched selectively. Finally, the resist is stripped off thereby obtaining a wafer having an uneven pattern.

By the above-mentioned pretreatment step 1, it becomes possible to obtain a wafer having at its surface an uneven pattern and containing at least one kind element of titanium, tungsten, aluminum, copper, tin, tantalum and ruthenium at surfaces of recessed portions of the uneven pattern.

Examples of the water-based cleaning liquid used in the pretreatment step 2 are water and an aqueous solution obtained by mixing at least one kind of an organic solvent, hydrogen peroxide, ozone, acid, alkali and surfactant with water (the aqueous solution having a water content of not less than 10 mass %, for example).

Furthermore, in the pretreatment step 2, the substitution with the water-based cleaning liquid may be conducted twice or more. The water-based cleaning liquids to be used in this case may be those different from each other.

Figure 2:
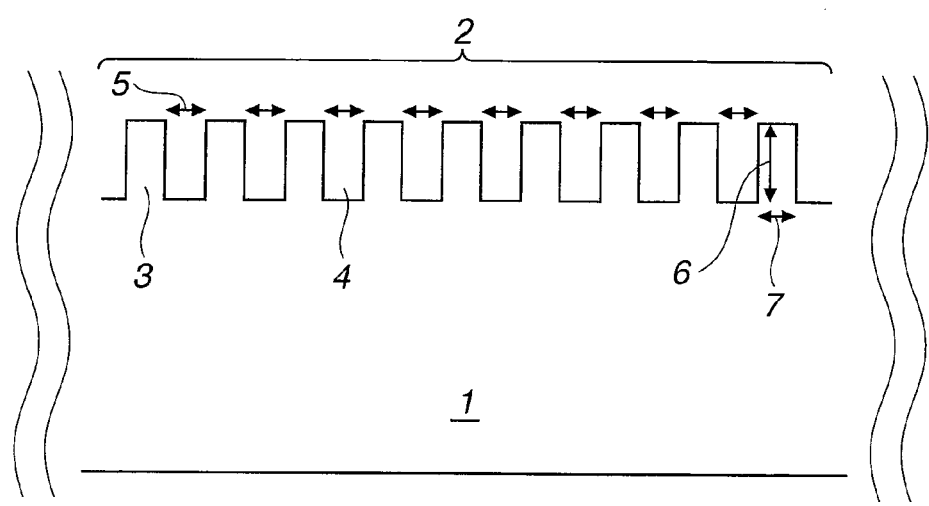
FIG. 2 is a schematic view showing a part of a-a' cross section of FIG. 1.

If recessed portions have a small width and projected portions have a large aspect ratio, and if the surface is cleaned with the water-based cleaning liquid in the pretreatment step 2 and subsequently the water-based cleaning liquid is removed by drying and the like or if water is removed by drying and the like after substituting the water-based cleaning liquid with water, a pattern collapse is to easily occur. The uneven pattern is defined as shown in FIG. 1 and FIG. 2. FIG. 1 is one example of a schematic perspective view of a wafer 1 of which surface is made into a surface having an uneven pattern 2. FIG. 2 shows a part of an a-a' cross section in FIG. 1. A width 5 of recessed portions is defined by an interval between a projected portion 3 and the projected portion 3, as shown in FIG. 2. The aspect ratio of projected portions is expressed by dividing a height 6 of the projected portions by a width 7 of the projected portions. The pattern collapse in the cleaning step is to easily occur when the recessed portions have a width of not more than 70 nm, particularly not more than 45 nm and when the aspect ratio is not less than 4, particularly not less than 6.

The cleaning liquid A used in the pretreatment step 3 refers to an organic solvent, a mixture of the organic solvent and a water-based cleaning liquid, or a cleaning liquid into which at least one kind of acid, alkali and surfactant is mixed with these. Furthermore, it is preferable to perform a step of retaining the liquid chemical for forming a protecting film at least in the recessed portions of the uneven pattern upon substituting the cleaning liquid A with the liquid chemical for forming a protecting film of the present invention (the protecting-film-forming step).

In the present invention, a style for cleaning the wafer is not particularly limited so long as the liquid chemical or the cleaning liquid can be retained at least in the recessed portions of the uneven pattern of the wafer. Examples of the style for cleaning the wafer are: a single cleaning style represented by spin cleaning where a generally horizontally held wafer is rotated and cleaned one by one while supplying a liquid to the vicinity of the center of the rotation; and a batch style where a plurality of wafer sheets are immersed in a cleaning bath to be cleaned. Incidentally, the form of the liquid chemical or the cleaning liquid at the time of supplying the liquid chemical or the cleaning liquid at least to the recessed portions of the uneven pattern of the wafer is not particularly limited as far as it is in a condition of liquid at time of being retained in the recessed portions, and is exemplified by liquid, vapor or the like.

The organic solvent, which serves as one of the preferable examples of the cleaning liquid A, are exemplified by hydrocarbons, esters, ethers, ketones, halogen-element containing solvents, sulfoxide-based solvents, lactone-based solvents, carbonate-based solvents, alcohols, polyalcohol derivatives, nitrogen element-containing solvents and the like.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, cyclohexanone and the like. Examples of the halogen-element containing solvents are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec 7100, Novec 7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifluoropropene and the like; perfluoroethers; perfluoropolyethers; and the like. Examples of the sulfoxide-based solvents are dimethyl sulfoxide and the like. Examples of the lactone-based solvents are γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, ε-hexanolactone and the like. Examples of the carbonate-based solvents are dimethyl carbonate, ethyl methyl carbonate, diethyl carbonate, propylene carbonate and the like. Examples of alcohols are methanol, ethanol, propanol, buthanol, ethylene glycol, diethylene glycol, 1,2-propanediol, 1,3-propanediol, dipropylene glycol, 1,2-butanediol, 1,3-butanediol, 1,4-butanediol, triethylene glycol, tripropylene glycol, tetraethylene glycol, tetrapropylene glycol, glycerine and the like. Examples of the polyalcohol derivatives are ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, triethylene glycol monomethyl ether, triethylene glycol monoethyl ether, triethylene glycol monopropyl ether, triethylene glycol monobutyl ether, tetraethylene glycol monomethyl ether, tetraethylene glycol monoethyl ether, tetraethylene glycol monopropyl ether, tetraethylene glycol monobutyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tripropylene glycol monoethyl ether, tripropylene glycol monopropyl ether, tripropylene glycol monobutyl ether, tetrapropylene glycol monomethyl ether, butylene glycol monomethyl ether, ethylene glycol dimethyl ether, ethylene glycol diethyl ether, ethylene glycol dibutyl ether, ethylene glycol monomethyl ether acetate, ethylene glycol monoethyl ether acetate, ethylene glycol monobutyl ether acetate, ethylene glycol diacetate, diethylene glycol dimethyl ether, diethylene glycol ethyl methyl ether, diethylene glycol diethyl ether, diethylene glycol buthyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol dimethyl ether, propylene glycol diethyl ether, propylene glycol dibutyl ether, propylene glycol monomethyl ether acetate, propylene glycol monoethyl ether acetate, propylene glycol monobutyl ether acetate, propylene glycol diacetate, dipropylene glycol dimethyl ether, dipropylene glycol methyl propyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol dimethyl ether, butylene glycol monomethyl ether acetate, butylene glycol diacetate, glycerine triacetate and the like. Examples of the nitrogen element-containing solvents are formamide, N,N-dimethylformamide, N,N-dimethylacetamide, N-methyl-2-pyrrolidone, diethylamine, triethylamine, pyridine and the like.

Incidentally, it is preferable that the cleaning liquid A is an organic solvent or a mixture liquid of water and an organic solvent in view of the cleanliness. Furthermore, it is preferable that the organic solvent contains a water-soluble organic solvent (so as to have a solubility of not smaller than 5 mass parts by weight relative to 100 parts by weight of water) because it can be easily substituted for the water-based cleaning liquid.

Additionally, in the pretreatment step 3, the substitution with the cleaning liquid A may be conducted twice or more. More specifically, the water-based cleaning liquid used in the pretreatment step 2 may be substituted with a first kind of cleaning liquid A, and successively, the first kind of cleaning liquid A may be substituted with two or more kinds of cleaning liquid A different from the above-mentioned cleaning liquid A, and then the liquid chemical for forming a protecting film may be substituted therefor.

Moreover, in a case where the water-based cleaning liquid used in the pretreatment step 2 can be substituted directly with the liquid chemical for forming a protecting film, the substitution with the cleaning liquid A (the pretreatment step 3) may be omitted.

Figure 3:
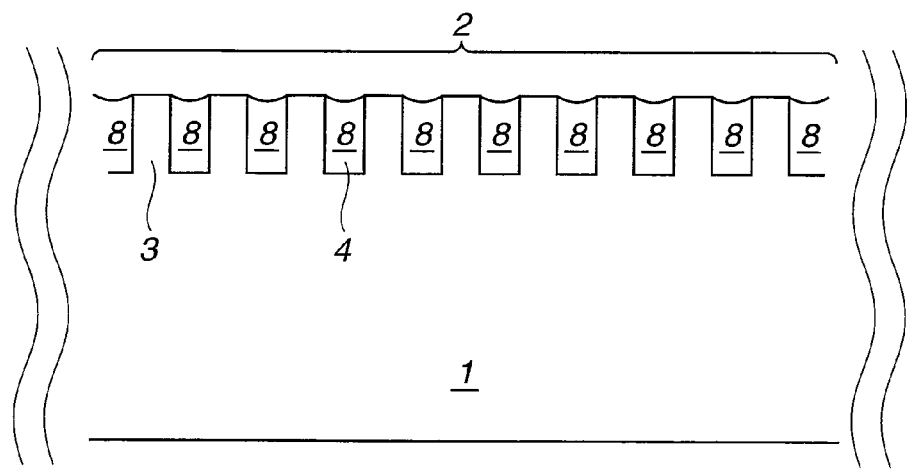
FIG. 3 is a schematic view showing a condition where a liquid chemical 8 for forming a protecting film is retained in recessed portions 4 in a cleaning step.

FIG. 3 is a schematic view showing a condition where the liquid chemical 8 for forming a protecting film is retained in recessed portions 4 in the protecting-film-forming step. The wafer of the schematic view of FIG. 3 shows a part of the a-a' cross section in FIG. 1. At this time, a protecting film is formed on the surfaces of the recessed portions 4 thereby imparting water repellency to the surfaces.

Incidentally, where the protecting film can be formed by the liquid chemical of the present invention is on a surface of a portion of the matter containing at least one kind of element among the metal-based elements, in the uneven pattern. Accordingly, the protecting film may be formed at least on a part of the surfaces of the recessed portions of the metal-based wafer. Additionally, also on a wafer formed of a plurality of components including the matter containing at least one kind of element of the metal-based elements, it is possible to form the protecting film on the surface of the matter containing at least one kind of element of the metal-based elements. Examples of the wafer formed of a plurality of components further include: those in which the matter containing at least one kind of element of the metal-based elements is formed at least at a part of the surfaces of the recessed portions; and those in which at least a part of the surfaces of the recessed portions becomes the matter containing at least one kind of element of the metal-based elements at the time of forming the uneven pattern.

Incidentally, the liquid chemical for forming a protecting film, according to the present invention can easily form an excellent water-repellent protecting film on the surface of an article containing titanium element at its surface. Therefore, it is preferable that the wafer is a wafer having at its surface an uneven pattern and containing titanium element at the surfaces of the recessed portions of the uneven pattern.

The liquid chemical for forming a protecting film is a liquid chemical containing a protecting-film-forming agent for forming a protecting film after a cleaning step for a metal-based wafer and before a drying step for the metal based wafer at least on the surfaces of the recessed portions and an organic solvent, and is characterized in that the agent for forming a water-repellent protecting film is a compound represented by the following general formula [1].

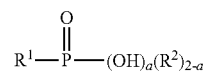

[1]

(In the formula [1], $R^1$ represents a $C_1$-$C_{18}$ monovalent hydrocarbon group the hydrogen elements of which may partially or entirely be replaced with a fluorine element(s). $R^2$ mutually independently represents a monovalent organic group having a $C_1$-$C_{18}$ hydrocarbon group the hydrogen elements of which may partially or entirely be replaced with a fluorine element(s). a is an integer of from 0 to 2.)

A hydrocarbon group contained in $R^2$ of the general formula [1] is exemplified by alkyl group, alkylene group, those in which hydrogen elements are partially or entirely substituted with a fluorine element(s), and the like.

Additionally, it is preferable that the above-mentioned $R^2$ is —$OR^4$ ($R^4$ is a hydrocarbon group having a carbon number of 1 to 18). Additionally, it is preferable that $R^4$ has a carbon number of 1 to 8 and particularly 1 to 4, since the water repellency is more excellently imparted thereby. Moreover, $R^4$ is preferably a straight-chained alkyl group.

As the compound represented by the general formula [1], it is possible to cite $CH_3P(O)(OH)_2$, $C_2H_5P(O)(OH)_2$, $C_3H_7P(O)(OH)_2$, $C_4H_9P(O)(OH)_2$, $C_5H_{11}P(O)(OH)_2$, $C_6H_{13}P(O)(OH)_2$, $C_7H_{15}P(O)(OH)_2$, $C_8H_{17}P(O)(OH)_2$, $C_9H_{19}P(O)(OH)_2$, $C_{10}H_{21}P(O)(OH)_2$, $C_{11}H_{23}P(O)(OH)_2$, $C_{12}H_{25}P(O)(OH)_2$, $C_{13}H_{27}P(O)(OH)_2$, $C_{14}H_{29}P(O)(OH)_2$, $C_{15}H_{31}P(O)(OH)_2$, $C_{16}H_{33}P(O)(OH)_2$, $C_{17}H_{35}P(O)(OH)_2$, $C_{18}H_{37}P(O)(OH)_2$, $C_6H_5P(O)(OH)_2$, $CF_3P(O)(OH)_2$, $C_2F_5P(O)(OH)_2$, $C_3F_7P(O)(OH)_2$, $C_4F_9P(O)(OH)_2$, $C_5F_{11}P(O)(OH)_2$, $C_6F_{13}P(O)(OH)_2$, $C_7F_{15}P(O)(OH)_2$, $C_8F_{17}P(O)(OH)_2$, $CF_3C_2H_4P(O)(OH)_2$, $C_2F_5C_2H_4P(O)(OH)_2$, $C_3F_7C_2H_4P(O)(OH)_2$, $C_4F_9C_2H_4P(O)(OH)_2$, $C_5F_{11}C_2H_4P(O)(OH)_2$, $C_6F_{13}C_2H_4P(O)(OH)_2$, $C_7F_{15}C_2H_4P(O)(OH)_2$, $C_8F_{17}C_2H_4P(O)(OH)_2$, and those obtained by substituting —$P(O)(OH)_2$ group of the above compounds with —$P(O)(OH)OCH_3$ group, —$P(O)(OH)OC_2H_5$ group, —$P(O)(OCH_3)_2$ group or —$P(O)(OC_2H_5)_2$ group.

Furthermore, in the protecting-film-forming agent, it is preferable that a of the general formula [1] is 1 or 2 in order to impart a better water repellency. The protecting-film-forming agent is more preferably a compound represented by the following general formula [2] in which a is 2.

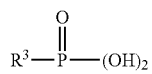

[2]

(In the formula [2], $R^3$ represents a $C_1$-$C_{18}$ monovalent hydrocarbon group the hydrogen elements of which may partially or entirely be replaced with a fluorine element(s).)

Examples of $R^1$ and $R^3$ of the general formulas [1] and [2] are: alkyl group; phenyl group; phenyl group the hydrogen element of which is substituted with alkyl group; naphthyl group; these hydrocarbon groups whose hydrogen elements are partially or entirely substituted with a fluorine element(s); and the like.

Moreover, it is preferable that $R^1$ and $R^3$ of the general formulas [1] and [2] have a carbon number of 2 to 16, particularly preferably 4 to 14 and much more preferably 6 to 14, since the water repellency is more excellently imparted thereby. Additionally, it is preferable that the hydrocarbon group whose hydrogen elements may partially or entirely be substituted with a fluorine element(s) is alkyl group and particularly a straight-chained alkyl group. If a straight-chained alkyl group is used as the hydrocarbon group, hydrophobic moieties of the protecting-film-forming agent tend to be arranged perpendicularly to the surface of the protecting film at the time of forming the protecting film thereby more excellently imparting a water-repellency-imparting effect, which is further preferable. Moreover, $R^1$ and $R^3$ of the general formulas [1] and [2] bring about a far better water repellency so as to preferably be a hydrocarbon group whose hydrogen elements are partially or entirely be substituted with a fluorine element(s).

Additionally, the protecting-film-forming agent may exist in the form of a salt represented by the general formulas [1] and [2]. The salt can be cited by ammonium salt, amine salt and the like.

Furthermore, the protecting-film-forming agent contained in the liquid chemical for forming a protecting film preferably has a concentration of 0.0005 to 2 mass % relative to the total quantity of 100 mass % of the liquid chemical. A concentration of smaller than 0.0005 mass % tends to make the water-repellency-imparting effect insufficient, while that of larger than 2 mass % tends to be insoluble in an organic solvent. A concentration of 0.001 to 1 mass % is more preferable, and 0.0015 to 0.8 mass % is particularly preferable.

As the organic solvent used for the liquid chemical for forming a protecting film, it is preferable to use, for example, water, an organic solvent, a mixture liquid of water and an organic solvent. The organic solvent is exemplified by hydrocarbons, esters, ethers, ketones, halogen-element containing solvents, sulfoxide-based solvents, lactone-based solvents, carbonate-based solvents, alcohols, polyalcohol derivatives, nitrogen element-containing solvents, and a mixture of these.

As concrete examples of the organic solvent, it is possible to cite the same as those that have been applied to the cleaning liquid A.

Additionally, it is preferable to use a nonflammable one as a part or the entire of the solvent since the liquid chemical for forming a protecting film becomes nonflammable or increases in flash point thereby reducing the risk of the liquid chemical. Most of the halogen-element containing solvents are nonflammable, so that such a halogen element-containing nonflammable solvent can be preferably used as a nonflammable organic solvent. Furthermore, water can be preferably used as the nonflammable solvent too.

Additionally, in view of safety under the fire protection law, it is preferable to use a solvent having a flash point exceeding 70° C. as the above-mentioned solvent.

Moreover, according to "Globally Harmonized System of Classification and Labelling of Chemicals; GHS", a solvent having a flash point of not higher than 93° C. is defined as "a flammable liquid". Therefore, when a solvent having a flash point exceeding 93° C. is used as the solvent, the liquid chemical for forming a protecting film tends to have a flash point exceeding 93° C. even if the solvent is not nonflammable one. Hence the liquid chemical hardly applies to "the flammable liquid", which is preferable in view of safety.

Additionally, most of the lactone-based solvents, carbonate-based solvents, alcohols having a high molecular weight or two or more OH groups and the polyalcohol derivatives have high flash point. It is therefore preferable to use these solvents because the risk of the liquid chemical for forming a protecting film can be reduced. In view of the safety, as the above-mentioned solvent, it is more preferable to use those having a flash point exceeding 70° C. such as γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, ε-hexanolactone, propylene carbonate, heptanol, octanol, ethylene glycol, diethylene glycol, 1,2-propanediol, 1,3-propanediol, dipropylene glycol, 1,2-butanediol, 1,3-butanediol, 1,4-butanediol, triethylene glycol, tripropylene glycol, tetraethylene glycol, tetrapropylene glycol, glycerine, diethylene glycol monomethyl ether, diethylene glycol monoethyl ether, diethylene glycol monopropyl ether, diethylene glycol monobutyl ether, triethylene glycol monomethyl ether, triethylene glycol monoethyl ether, triethylene glycol monopropyl ether, triethylene glycol monobutyl ether, tetraethylene glycol monomethyl ether, tetraethylene glycol monoethyl ether, tetraethylene glycol monopropyl ether, tetraethylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tripropylene glycol monoethyl ether, tripropylene glycol monopropyl ether, tripropylene glycol monobutyl ether, tetrapropylene glycol monomethyl ether, ethylene glycol dibutyl ether, ethylene glycol monobutyl ether acetate, ethylene glycol diacetate, diethylene glycol ethyl methyl ether, diethylene glycol diethyl ether, diethylene glycol buthyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol diacetate, dipropylene glycol methyl propyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol diacetate, glycerine triacetate and the like. Additionally, as the above-mentioned solvent, it is much more preferable to use those having a flash point exceeding 93° C. such as γ-butyrolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, ε-hexanolactone, propylene carbonate, ethylene glycol, diethylene glycol, 1,2-propanediol, 1,3-propanediol, dipropylene glycol, 1,2-butanediol, 1,3-butanediol, 1,4-butanediol, triethylene glycol, tripropylene glycol, tetraethylene glycol, tetrapropylene glycol, glycerine, diethylene glycol monomethyl ether, diethylene glycol monopropyl ether, diethylene glycol monobutyl ether, triethylene glycol monomethyl ether, triethylene glycol monoethyl ether, triethylene glycol monopropyl ether, triethylene glycol monobutyl ether, tetraethylene glycol monomethyl ether, tetraethylene glycol monoethyl ether, tetraethylene glycol monopropyl ether, tetraethylene glycol monobutyl ether, dipropylene glycol monopropyl ether, dipropylene glycol monobutyl ether, tripropylene glycol monomethyl ether, tripropylene glycol monoethyl ether, tripropylene glycol monopropyl ether, tripropylene glycol monobutyl ether, tetrapropylene glycol monomethyl ether, ethylene glycol diacetate, diethylene glycol buthyl methyl ether, diethylene glycol dibutyl ether, diethylene glycol diacetate, diethylene glycol monomethyl ether acetate, diethylene glycol monoethyl ether acetate, diethylene glycol monobutyl ether acetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol diacetate, dipropylene glycol diacetate, dipropylene glycol monomethyl ether acetate, dipropylene glycol monoethyl ether acetate, dipropylene glycol monobutyl ether acetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol diacetate, glycerine triacetate and the like.

Furthermore, from reasons of imparting a more excellent water repellency, it is preferable to use: hydrocarbons, esters, ethers, ketones, lactone-based solvents, carbonate-based solvents, polyalcohol derivatives having no hydroxy group, water, or a mixture liquid of these. Additionally, in consideration of substitutability with the water-based cleaning liquid, it is preferable to use: polyalcohol derivatives having no hydroxyl group; water; or a mixture liquid of these. In order to more greatly dissolve the protecting-film-forming agent, the above-mentioned solvent may contain some alcohols. In this case the concentration of the alcohols is preferably not larger than 10 mass %, particularly preferably not larger than 5 mass %, much more preferably not larger than 3 mass % relative to 100 mass % of the liquid chemical for forming a protecting film.

Additionally, in order to accelerate the formation of the protecting film due to the protecting-film-forming agent, a catalyst may be added to the liquid chemical for forming a protecting film. The added amount of the catalyst is preferably 0.01 to 50 mass % relative to the total quantity of 100 mass % of the protecting-film-forming agent.

When increasing the temperature of the liquid chemical for forming a protecting film, the protecting film can be formed in a shorter time. A temperature at which a uniform protecting film can be readily formed is not lower than 10° C. and lower than the boiling point of the liquid chemical. Particularly, it is preferable to keep a temperature of not lower than 15° C. and not higher than a temperature 10° C. lower than the boiling point of the liquid chemical. It is preferable that the temperature of the liquid chemical is kept at the above-mentioned temperature while the liquid chemical is being retained at least in the recessed portions of the uneven pattern. Incidentally, the boiling point of the liquid chemical means the boiling point of a component having the most amount among components contained in the water-repellent liquid chemical, in mass ratio.

After the protecting film-forming step, the liquid chemical that remains at least in the recessed portions of the uneven pattern may be substituted (hereinafter, this may sometimes be referred to as "a subsequent cleaning step") with a cleaning liquid different from the above-mentioned liquid chemical (hereinafter, this cleaning liquid may sometimes be referred to as "a cleaning liquid B"), and may subsequently be brought into a drying step. Examples of the cleaning liquid B are: a water-based cleaning liquid, an organic solvent; a mixture of the water-based cleaning liquid and the organic solvent; those into which at least one kind of acid, alkali and a surfactant is mixed; those in which the protecting-film-forming agent used for the liquid chemical for forming a protecting film is contained at a concentration lower than that of the liquid chemical; and the like. From the viewpoint of removing particles and metal impurities, it is more preferable that the cleaning liquid B is water, an organic solvent or a mixture of water and the organic solvent.

Furthermore, in the subsequent cleaning step, the substitution with the cleaning liquid B may be conducted twice or more. More specifically, the liquid chemical for forming a protecting film may be substituted with a first kind of cleaning liquid B, and successively, it may further be substituted with two or more kinds of cleaning liquid B different from the first kind of cleaning liquid B. The liquid chemical may be brought into the drying step thereafter.

The organic solvent, which is one of the preferable examples of the cleaning liquid B, is exemplified by hydrocarbons, esters, ethers, ketones, halogen-element containing solvents, sulfoxide-based solvents, alcohols, polyalcohol derivatives, nitrogen element-containing solvents, and the like.

As concrete examples of the organic solvent, it is possible to cite the same as those that have been applied to the cleaning liquid A.

Moreover, if an organic solvent is used as the cleaning liquid B, the water repellency of the protecting film formed on the wafer surface by the liquid chemical of the present invention tends to reduce little by the subsequent cleaning step.

Figure 4:
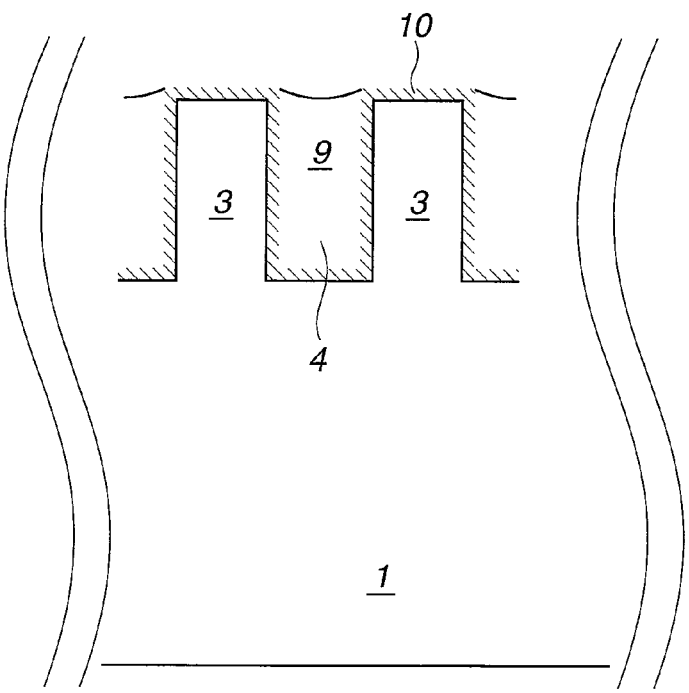
FIG. 4 is a schematic view showing a condition where a liquid is retained in the recessed portions 4 on which the protecting film is formed.

There is shown in FIG. 4 a schematic view showing a state where a liquid is retained in the recessed portions 4 provided with water repellency by the liquid chemical for forming a protecting film. The wafer as shown in the schematic view of FIG. 4 shows a part of the a-a' cross section in FIG. 1. The surface formed having the uneven pattern is coated with a protecting film 10 by the liquid chemical thereby being provided with water repellency. Furthermore, the protecting film 10 is retained on the wafer surface even when the liquid 9 is removed from the uneven pattern.

When the protecting film 10 is formed at least on the surfaces of the recessed portions of the uneven pattern of the wafer by the liquid chemical for forming a protecting film, a contact angle of from 50 to 130° is preferable on the assumption that water is retained on the surfaces, because the pattern collapse becomes difficult to occur thereby. The closer to 90° the contact angle is, the smaller the capillary force acting on the recessed portions becomes. It is therefore further preferable that the contact angle is 60 to 120°, particularly preferably 65 to 115° because the pattern collapse becomes further difficult to occur. Furthermore, the capillary force is preferably not higher than 2.1 $MN/m^2$. The capillary force of not higher than 2.1 $MN/m^2$ is preferable because the pattern collapse becomes difficult to occur. Additionally, a lower capillary force makes the pattern collapse more difficult to occur, so that a capillary force of 1.6 $MN/m^2$ or lower is further preferable and that of not higher than 1.4 $MN/m^2$ is particularly preferable. Furthermore, it is ideal to put the capillary force close to 0.0 $MN/m^2$ as much as possible by adjusting the contact angle to the liquid to around 90°.

Then, as discussed in the drying step, there is conducted a step of removing a liquid from the uneven pattern by drying, the liquid being retained in the recessed portions 4 on which the protecting film is formed by the liquid chemical. At this time, the liquid retained in the recessed portions may be the liquid chemical used in the protecting-film-forming step, the cleaning liquid B used in the subsequent cleaning step, or a mixture liquid of these. The mixture liquid is one in which the protecting-film-forming agent is contained in the liquid chemical for forming a protecting film at a concentration lower than that of the liquid chemical. The mixture liquid may be a liquid which is on the way to substitution of the liquid chemical with the cleaning liquid B, or a mixture liquid obtained by previously mixing the protecting-film-forming agent with the cleaning liquid B. In view of the cleanliness of the wafer, it is particularly use water, an organic solvent, or a mixture of water and the organic solvent. Additionally, it is possible to bring the cleaning liquid B retained on the unevenly patterned surface after once removing liquid from the unevenly patterned surface. Drying may be conducted thereafter.

Incidentally, in a case of performing a cleaning treatment (the subsequent cleaning step) after a surface treatment with the liquid chemical, a time for this step, i.e. a time to retain the cleaning liquid B is preferably not shorter than 10 seconds, more preferably not shorter than 20 seconds from the viewpoint of removing particles and impurities from the unevenly patterned surface. In view of the effect of maintaining a water-repellent performance of the protecting film formed on the unevenly patterned surface, if an organic solvent is used as the cleaning liquid B, the water repellency of the wafer surface tends to become easily maintained even after conducting the subsequent cleaning step. On the other hand, a too long time for the cleaning treatment can reduce the productivity, and therefore the time is preferably within 15 minutes.

In the drying step, a liquid retained on the uneven pattern is removed by drying. The drying is preferably conducted by a conventionally known drying method such as spin drying, IPA (2-propanol) steam drying, Marangoni drying, heating drying, warm air drying, vacuum drying and the like.

Then, as discussed in the film-removing step, there is performed a step of removing the protecting film 10. In the case of removing the water-repellent protecting film, it is effective to cleave C—C bond and C—F bond in the water-repellent protecting film. A method therefor is not particularly limited so long as it is possible to cleave the above-mentioned bonds, and exemplified by: irradiating the wafer surface with light; heating the wafer; exposing the wafer to ozone; irradiating the wafer surface with plasma; subjecting the wafer surface to corona discharge; and the like.

In the case of removing the protecting film 10 by light irradiation, it is preferable to conduct an irradiation with ultraviolet rays having a wavelength of shorter than 340 nm and 240 nm (corresponding to bond energies of C—C bond and C—F bond in the water-repellent film, i.e., 83 kcal/mol and 116 kcal/mol, respectively). As the light source therefor, there is used a metal halide lamp, a low-pressure mercury lamp, a high-pressure mercury lamp, an excimer lamp, a carbon arc or the like. In the case of the metal halide lamp, the intensity of the ultraviolet irradiation is preferably not less than 100 $mW/cm^2$, particularly preferably not less than 200 $mW/cm^2$, as a measurement value obtained by the illuminance meter (Intensity meter UM-10 produced by Konica Minolta Sensing, Inc., Light-Receptor UM-360 [Peak sensitivity wavelength: 365 nm, Measured wavelength range: 310 to 400 nm]). Incidentally, an irradiation intensity of less than 100 $mW/cm^2$ takes a long time to remove the protecting film 10. Additionally, in the case of the low-pressure mercury lamp, the ultraviolet irradiation is performed with shorter wavelengths so that removal of the protecting film 10 is achieved in a short time even if the intensity is low, which is therefore preferable.

Additionally, in the case of removing the protecting film 10 by light irradiation, it is particularly preferable to generate ozone in parallel with decomposing the components of the protecting film 10 by ultraviolet rays and then to induce oxidation-volatilization of the components of the protecting film 10 by the ozone, since a treatment time is saved thereby. As the light source therefor, the low-pressure mercury lamp, the excimer lamp or the like is used. Moreover, the wafer may be heated while being subjected to light irradiation.

In the case of heating the wafer, heating of the wafer is conducted at 400 to 1000° C., preferably at 500 to 900° C. The heating time is preferably kept from 10 seconds to 60 minutes, more preferably from 30 seconds to 10 minutes. Additionally, this step may be conducted in combination with ozone exposure, plasma irradiation, corona discharge or the like. Furthermore, the light irradiation may be conducted while heating the wafer.

As the method for removing the protecting film 10 by heating, there are a method of bringing a wafer into contact with a heat source, a method of bringing a wafer into a heated atmosphere such as a heat treatment furnace, and the like. The method of bringing a wafer into a heated atmosphere can easily and uniformly provide the wafer surface with energy for removing the protecting film 10 even in a case where two or more wafers are subjected to a treatment. This method is operationally convenient, achieves the treatment within a short period of time and has high treatment ability. Therefore, this is an industrially advantageous method.

In the case of exposing the wafer to ozone, it is preferable to expose the wafer surface to ozone generated by ultraviolet irradiation using the low-pressure mercury lamp, low-temperature discharge using high voltages or the like. The wafer may be irradiated with light or heated while being exposed to ozone.

In the film-removing step, the protecting film on the wafer surface can be efficiently removed by combining the above-mentioned light irradiation, heating, ozone exposure, plasma irradiation and corona discharge.

EXAMPLES

To make a wafer surface into a surface having an uneven pattern and to substitute a cleaning liquid retained at least in recessed portions of the uneven pattern with another cleaning liquid are techniques that have been variously studied and already been established as discussed in other literatures and the like. Accordingly, in the present invention, evaluations of a liquid chemical for forming a protecting film were mainly performed. Additionally, as apparent from the following equation, a pattern collapse greatly depends on the contact angle of the cleaning liquid to the wafer surface, i.e. the contact angle of liquid drop, and on the surface tension of the cleaning liquid.

$$P = 2 \times \gamma \times \cos\theta / S$$

(In the equation, $\gamma$ represents the surface tension of a liquid retained in the recessed portions, $\theta$ represents the contact angle of the liquid retained in the recessed portions to the surfaces of the recessed portions, and S represents the width of the recessed portions.)

In a case of a cleaning liquid retained in recessed portions 4 of an uneven pattern 2, the contact angle of liquid drop and the capillary force acting on the recessed portions (which force is regarded as an equivalent of the pattern collapse) are in correlation with each other, so that it is also possible to derive the capillary force from the equation and the evaluations made on the contact angle of liquid drop to a protecting film 10. In Examples, a representative of a water-based cleaning liquid, water, was used as the cleaning liquid.

However, in the case of a wafer having an unevenly patterned surface, it is not possible to exactly evaluate the contact angle of the protecting film 10 itself, the protecting film being formed on the unevenly patterned surface.

An evaluation of the contact angle of waterdrop is conducted by dropping several microliters of waterdrop on a surface of a sample (a substrate) and then by measuring an angle formed between the waterdrop and the substrate surface, as discussed in JIS R 3257 (Testing method of wettability of glass substrate surface). However, in the case of the wafer having a pattern, the contact angle is enormously large. This is because Wenzel's effect or Cassie's effect is caused so that an apparent contact angle of the waterdrop is increased under the influence of a surface shape (roughness) of the substrate upon the contact angle.

In view of the above, in the present examples, the liquid chemical is provided to a wafer having a smooth surface to form a protecting film on the wafer surface, on which various evaluations were performed by regarding the protecting film as the protecting film 10 formed on a surface of a wafer 1 having at its surface the uneven pattern 2). In the present examples, "a wafer having a titanium nitride film" (represented by TiN in Tables) which has a titanium nitride layer on a silicon wafer having a smooth surface, "a wafer having a tungsten film" (represented by W in Tables) which has a tungsten layer on a silicon wafer having a smooth surface, and "a wafer having a ruthenium film" (represented by Ru in Tables) which has a ruthenium layer on a silicon wafer having a smooth surface were used as the wafer having the smooth surface.

Details will be discussed below. Hereinafter, there will be discussed: a method for evaluating a wafer to which a liquid chemical for forming a protecting film is provided; a preparation of the liquid chemical for forming a protecting film; and evaluation results after providing the liquid chemical for forming a protecting film to the wafer.

[Method for Evaluating Wafer to which Liquid Chemical for Forming Protecting Film is Provided]

As a method for evaluating a wafer to which a liquid chemical for forming a protecting film is provided, the following evaluations (1) to (4) were performed.

(1) Evaluation of Contact Angle of Protecting Film formed on Wafer Surface

About 2 μl of pure water was dropped on a wafer surface on which a protecting film was formed, followed by measuring an angle (contact angle) formed between the waterdrop and the wafer surface by using a contact angle meter (produced by Kyowa Interface Science Co., Ltd.: CA-X Model). In this evaluation, a wafer having a contact angle within a range of from 50 to 130° to the protecting film was classified as an acceptable one.

(2) Evaluation of Capillary Force

The capillary force (the absolute value of P) was obtained by calculating P by using the following equation.

$$P = 2 \times \gamma \times \cos\theta / S$$

(In the equation, $\gamma$ represents the surface tension of a liquid retained in the recessed portions, $\theta$ represents the contact angle of the liquid retained in the recessed portions to the surfaces of the recessed portions, and S represents the width of the recessed portions.)

Incidentally, the present example was made on the assumption that a wafer formed having a line-and-space pattern the line width (the width of the recessed portions) of which was 45 nm, as an example of a pattern shape. The pattern having a line width of 45 nm tends to cause its collapse in a case where a cleaning liquid used when a gas-liquid interface passes through the uneven pattern is water, while the pattern collapse tends to be difficult to occur in a case of 2-propanol. If the wafer surface is titanium nitride, tungsten or ruthenium, for example, the contact angle of 2-propanol to the surface is 0.5° in either case, and similarly the contact angle of water is 2° in either case. Also concerning the other matters containing titanium element, tungsten element or ruthenium element (such as titanium, titanium oxide, tungsten oxide and ruthenium oxide), the degree of the contact angle is as much as the above. In a case where the pattern width is 45 nm and the wafer surface is titanium nitride (the wafer having the titanium nitride film), tungsten (the wafer having the tungsten film) or ruthenium (the wafer having the ruthenium film) and where the cleaning liquid is 2-propanol (Surface tension: 22 mN/m), the capillary force is 0.98 MN/m². On the other hand, in a case of water (Surface tension: 72 mN/m) having the largest surface tension among liquids other than mercury, the capillary force results in 3.2 MN/m².

(3) Removability of Protecting Film

Under the following conditions, a sample was irradiated with UV rays from a metal halide lamp for 2 hours, upon which an evaluation of removability of the protecting film at the film-removing step was made. A sample on which waterdrop had a contact angle of not larger than 30° after the irradiation was classified as acceptable one.

Lamp: M015-L312 produced by EYE GRAPHICS CO., LTD. (Intensity: 1.5 kW)
Illuminance: 128 mW/cm² as a measurement value obtained under the following conditions
Measuring Apparatus: Ultraviolet Intensity Meter (UM-10 produced by Konica Minolta Sensing, Inc.)
Light-Receptor: UM-360 (Light-Receptive Wavelength: 310-400 nm, Peak Wavelength: 365 nm)
Measuring Mode: Irradiance Measurement (4) Evaluation of Surface Smoothness of Wafer after Removing Protecting Film The surface was observed by atomic force microscope (produced by Seiko Instruments Inc.: SPI3700, 2.5 micrometer square scan). Then, there was obtained a difference ΔRa (nm) in the centerline average surface roughness Ra (nm) of the surface of the wafer between before and after the cleaning. Incidentally, Ra is a three-dimensionally enlarged one obtained by applying the centerline average roughness defined by JIS B 0601 to a measured surface and is calculated as "an average value of absolute values of difference from standard surface to designated surface" from the following equation.

$$Ra = \frac{1}{S_0} \int_{Y_T}^{Y_B} \int_{X_L}^{X_R} |F(X, Y) - Z_0| \, dX \, dY$$

Here, $X_L$ and $X_R$, and $Y_B$ and $Y_T$ represent a measuring range in the X coordinate and the Y coordinate, respectively. $S_0$ represents an area on the assumption that the measured surface is ideally flat, and is a value obtained by $(X_R - X_L) \times (Y_B - Y_T)$. Additionally, $F(X,Y)$ represents the height at a measured point $(X,Y)$. $Z_0$ represents the average height within the measured surface.

The Ra value of the wafer surface before the protecting film was formed thereon and the Ra value of the wafer surface after the protecting film was removed therefrom were measured. If a difference between them (ΔRa) was within ±1 nm, the wafer surface was regarded as not being eroded by the cleaning and as not leaving residues of the protecting film thereon, and therefore classified as an acceptable one.

Example 1

(I-1) Preparation of Liquid Chemical for Forming Protecting Film

A mixture of 0.002 g of octadecylphosphonic acid [$C_{18}H_{37}P(O)(OH)_2$] serving as an agent for forming a water-repellent protecting film and 99.998 g of propylene glycol monomethyl ether acetate (hereinafter referred to as "PGMEA") serving as an organic solvent was stirred for about 18 hours thereby obtaining a liquid chemical for forming a protecting film, in which liquid chemical the protecting-film-forming agent had a concentration of 20 mass ppm relative to the total quantity of the liquid chemical for forming a protecting film (hereinafter referred to as "a protecting-film-forming agent concentration").

(I-2) Step of Cleaning Wafer (Pretreatment Step)

As a pretreatment step 2, a wafer having a smooth titanium nitride film (a silicon wafer formed having on its surface a titanium nitride layer of 50 nm thickness) was immersed in 1 mass % aqueous hydrogen peroxide for 1 minute at room temperature, and then immersed in pure water for 1 minute. Furthermore, as a pretreatment step 3, the wafer was immersed in isopropyl alcohol (hereinafter referred to as "iPA") for 1 minute.

(I-3) From Step of Forming Protecting Film on Wafer Surface to Drying Step

As a protecting-film-forming step, the wafer having the titanium nitride film was immersed in the liquid chemical for forming a protecting film at 20° C. for 10 minutes, the liquid chemical having been prepared in the above "(I-1) Preparation of Liquid Chemical for forming Protecting Film" section, thereby forming a protecting film on the wafer surface. Thereafter, the wafer having the titanium nitride film was immersed in iPA for 1 minute, as a subsequent cleaning step. Then, as a drying step, the wafer having the titanium nitride film was taken out of iPA, followed by spraying air thereon to remove iPA from the surface.

As a result of evaluating the obtained wafer having the titanium nitride film in a manner discussed in the above [Method for evaluating Wafer to which Liquid Chemical for forming Protecting Film is provided] section, a wafer in which an initial contact angle before the surface treatment was smaller than 10° was confirmed to have a contact angle of 106° after the surface treatment, as shown in Table 1. With this, a water-repellency-imparting effect was excellently exhibited. Additionally, as a result of calculating the capillary force at the time of retaining water by using the equation discussed in the above "Evaluation of Capillary Force" section, the capillary force was so small as to be 0.9 MN/m². Additionally, the contact angle after UV irradiation was smaller than 10°, so that removal of the protecting film was achieved. Furthermore, the ΔRa value of the wafer after UV irradiation was within ±0.5 nm, with which it was confirmed that the wafer was not eroded at the time of cleaning and that residues of the protecting film did not remain after UV irradiation.

TABLE 1

| | Liquid chemical for forming protecting film | | | | Cleaning liquid for pretreatment step 3 | Protecting-film-forming step | |
|---|---|---|---|---|---|---|---|
| | Protecting-film-forming agent | Solvent | Protecting-film-forming agent concentration [mass ppm] | Wafer | | Temperature [C.°] | Time [min] |
| Example 1 | $C_{18}H_{37}P(O)(OH)_2$ | PGMEA | 20 | TiN | iPA | 20 | 10 |
| Example 2 | $C_{12}H_{25}P(O)(OH)_2$ | PGMEA | 20 | TiN | iPA | 20 | 10 |
| Example 3 | $C_{12}H_{25}P(O)(OH)_2$ | PGMEA | 30 | TiN | iPA | 20 | 10 |
| Example 4 | $C_{12}H_{25}P(O)(OH)_2$ | PGMEA | 50 | TiN | iPA | 20 | 10 |
| Example 5 | $C_{12}H_{25}P(O)(OH)_2$ | PGMEA | 50 | TiN | iPA | 20 | 1 |
| Example 6 | $C_{12}H_{25}P(O)(OH)_2$ | PGMEA | 50 | TiN | iPA | 40 | 10 |
| Example 7 | $C_{12}H_{25}P(O)(OH)_2$ | Cyclohexanone | 50 | TiN | iPA | 20 | 10 |
| Example 8 | $C_{12}H_{25}P(O)(OH)_2$ | iPA | 50 | TiN | iPA | 20 | 10 |
| Example 9 | $C_{12}H_{25}P(O)(OH)_2$ | THF | 50 | TiN | iPA | 20 | 10 |
| Example 10 | $C_{12}H_{25}P(O)(OH)_2$ | Water | 20 | TiN | iPA | 20 | 10 |
| Example 11 | $C_{10}H_{21}P(O)(OH)_2$ | PGMEA | 30 | TiN | iPA | 20 | 10 |
| Example 12 | $C_{10}H_{21}P(O)(OH)_2$ | PGMEA | 50 | TiN | iPA | 20 | 10 |
| Example 13 | $C_{10}H_{21}P(O)(OH)_2$ | PGMEA | 50 | TiN | iPA | 20 | 1 |
| Example 14 | $C_{10}H_{21}P(O)(OH)_2$ | Cyclohexanone | 50 | TiN | iPA | 20 | 10 |
| Example 15 | $C_{10}H_{21}P(O)(OH)_2$ | iPA | 50 | TiN | iPA | 20 | 10 |
| Example 16 | $C_{10}H_{21}P(O)(OH)_2$ | Water | 50 | TiN | iPA | 20 | 10 |
| Example 17 | $C_{10}H_{21}P(O)(OH)_2$ | PGMEA | 50 | TiN | iPA | 40 | 10 |
| Example 18 | $C_{10}H_{21}P(O)(OC_2H_5)_2$ | PGMEA | 1000 | TiN | iPA | 40 | 10 |
| Example 19 | $C_8H_{17}P(O)(OH)_2$ | PGMEA | 50 | TiN | iPA | 20 | 10 |
| Example 20 | $C_8H_{17}P(O)(OH)_2$ | PGMEA | 100 | TiN | iPA | 20 | 10 |
| Example 21 | $C_8H_{17}P(O)(OH)_2$ | PGMEA | 300 | TiN | iPA | 20 | 10 |
| Example 22 | $C_8H_{17}P(O)(OH)_2$ | Cyclohexanone | 300 | TiN | iPA | 20 | 10 |
| Example 23 | $C_8H_{17}P(O)(OH)_2$ | iPA | 300 | TiN | iPA | 20 | 10 |
| Example 24 | $C_8H_{17}P(O)(OH)_2$ | Water | 300 | TiN | iPA | 20 | 10 |
| Example 25 | $C_8H_{17}P(O)(OH)_2$ | PGMEA | 300 | TiN | iPA | 40 | 10 |
| Example 26 | $C_6F_{13}-C_2H_4-P(O)(OH)_2$ | PGMEA | 50 | TiN | iPA | 20 | 10 |
| Example 27 | $C_6F_{13}-C_2H_4-P(O)(OH)_2$ | PGMEA | 100 | TiN | iPA | 20 | 10 |
| Example 28 | $C_6F_{13}-C_2H_4-P(O)(OH)_2$ | PGMEA | 100 | TiN | iPA | 40 | 10 |
| Example 29 | $C_6F_{13}-C_2H_4-P(O)(OH)_2$ | PGMEA | 100 | TiN | iPA | 70 | 10 |
| Example 30 | $C_6F_{13}-C_2H_4-P(O)(OH)_2$ | PGMEA/iPA | 500 | TiN | iPA | 20 | 10 |

| | Subsequent cleaning step | | Evaluation results | | | |
|---|---|---|---|---|---|---|
| | Cleaning liquid for subsequent cleaning step | Time [min] | Initial contact angle [°] | Contact angle after surface treatment ([°]) | Capillary force ([MN/m²]) <Calculated value> | Removability of protecting film (Contact angle [°]) | Surface smoothness (ΔRa [nm]) |
| Example 1 | iPA | 1 | <10 | 106 | 0.9 | <10 | Within ±0.5 |
| Example 2 | iPA | 1 | <10 | 98 | 0.5 | <10 | Within ±0.5 |
| Example 3 | iPA | 1 | <10 | 98 | 0.5 | <10 | Within ±0.5 |
| Example 4 | iPA | 1 | <10 | 100 | 0.6 | <10 | Within ±0.5 |
| Example 5 | iPA | 1 | <10 | 98 | 0.5 | <10 | Within ±0.5 |
| Example 6 | iPA | 1 | <10 | 101 | 0.6 | <10 | Within ±0.5 |
| Example 7 | iPA | 1 | <10 | 100 | 0.6 | <10 | Within ±0.5 |
| Example 8 | iPA | 1 | <10 | 70 | 1.1 | <10 | Within ±0.5 |
| Example 9 | iPA | 1 | <10 | 92 | 0.1 | <10 | Within ±0.5 |
| Example 10 | iPA | 1 | <10 | 98 | 0.5 | <10 | Within ±0.5 |
| Example 11 | iPA | 1 | <10 | 95 | 0.3 | <10 | Within ±0.5 |
| Example 12 | iPA | 1 | <10 | 98 | 0.4 | <10 | Within ±0.5 |
| Example 13 | iPA | 1 | <10 | 96 | 0.3 | <10 | Within ±0.5 |
| Example 14 | iPA | 1 | <10 | 98 | 0.4 | <10 | Within ±0.5 |
| Example 15 | iPA | 1 | <10 | 68 | 1.2 | <10 | Within ±0.5 |
| Example 16 | iPA | 1 | <10 | 96 | 0.3 | <10 | Within ±0.5 |
| Example 17 | iPA | 1 | <10 | 99 | 0.5 | <10 | Within ±0.5 |
| Example 18 | iPA | 1 | <10 | 54 | 1.9 | <10 | Within ±0.5 |
| Example 19 | iPA | 1 | <10 | 85 | 0.3 | <10 | Within ±0.5 |
| Example 20 | iPA | 1 | <10 | 93 | 0.2 | <10 | Within ±0.5 |
| Example 21 | iPA | 1 | <10 | 94 | 0.2 | <10 | Within ±0.5 |
| Example 22 | iPA | 1 | <10 | 92 | 0.1 | <10 | Within ±0.5 |
| Example 23 | iPA | 1 | <10 | 64 | 1.4 | <10 | Within ±0.5 |
| Example 24 | iPA | 1 | <10 | 94 | 0.2 | <10 | Within ±0.5 |

TABLE 1-continued

| Example 25 | iPA | 1 | <10 | 96  | 0.3 | <10 | Within ±0.5 |
| Example 26 | iPA | 1 | <10 | 108 | 1   | <10 | Within ±0.5 |
| Example 27 | iPA | 1 | <10 | 108 | 1   | <10 | Within ±0.5 |
| Example 28 | iPA | 1 | <10 | 110 | 1.1 | <10 | Within ±0.5 |
| Example 29 | iPA | 1 | <10 | 110 | 1.1 | <10 | Within ±0.5 |
| Example 30 | iPA | 1 | <10 | 112 | 1.2 | <10 | Within ±0.5 |

Examples 2 to 84

Upon suitably modifying those used in Example 1 (i.e., the protecting-film-forming agent, the solvent for the liquid chemical for forming a protecting film, the protecting-film-forming agent concentration, the time for the protecting-film-forming step, the temperature of the protecting-film-forming step and the cleaning liquid for the subsequent cleaning step), the surface treatment was conducted on a wafer. Then, evaluations were performed thereon. The results are shown in Table 1 to Table 3.

TABLE 2

| | Liquid chemical for forming protecting film | | | | Protecting-film-forming step | | Subsequent cleaning step | | | Evaluation results | | | | |
|---|---|---|---|---|---|---|---|---|---|---|---|---|---|---|
| | Protecting-film-forming agent | Solvent | Protecting-film-forming agent concentration [mass ppm] | Wafer | Cleaning liquid for pretreatment step 3 | Temperature [C.°] | Time [min] | Cleaning liquid for subsequent cleaning step | Time [min] | Initial contact angle [°] | Contact angle after surface treatment [°] | Capillary force ([MN/m²]) <Calculated value> | Removability of protecting film (Contact angle [°]) | Surface smoothness (ΔRa [nm]) |
| Example 31 | C₆F₁₃—C₂H₄—P(O)(OH)₂ | Cyclohexanone | 100 | TiN | iPA | 20 | 10 | iPA | 1 | <10 | 108 | 1 | <10 | Within ±0.5 |
| Example 32 | C₆F₁₃—C₂H₄—P(O)(OH)₂ | iPA | 100 | TiN | iPA | 20 | 10 | iPA | 1 | <10 | 96 | 0.3 | <10 | Within ±0.5 |
| Example 33 | C₆F₁₃—C₂H₄—P(O)(OH)₂ | Water | 100 | TiN | iPA | 20 | 10 | iPA | 1 | <10 | 110 | 1.1 | <10 | Within ±0.5 |
| Example 34 | C₆F₁₃—C₂H₄—P(O)(OH)₂ | Water | 100 | TiN | iPA | 40 | 10 | iPA | 1 | <10 | 110 | 1.1 | <10 | Within ±0.5 |
| Example 35 | C₆F₁₃—C₂H₄—P(O)(OH)₂ | PGME | 100 | TiN | iPA | 20 | 10 | iPA | 1 | <10 | 98 | 0.4 | <10 | Within ±0.5 |
| Example 36 | C₆F₁₃—C₂H₄—P(O)(OH)₂ | DEGME | 100 | TiN | iPA | 20 | 10 | iPA | 1 | <10 | 98 | 0.4 | <10 | Within ±0.5 |
| Example 37 | C₆F₁₃—C₂H₄—P(O)(OH)₂ | DEGDEE | 100 | TiN | iPA | 20 | 10 | iPA | 1 | <10 | 110 | 1.1 | <10 | Within ±0.5 |
| Example 38 | C₆F₁₃—C₂H₄—P(O)(OH)₂ | DEGEEA | 100 | TiN | iPA | 20 | 10 | iPA | 1 | <10 | 108 | 1 | <10 | Within ±0.5 |
| Example 39 | C₆F₁₃—C₂H₄—P(O)(OH)₂ | DEGEEA/iPA | 100 | TiN | iPA | 20 | 10 | iPA | 1 | <10 | 108 | 1 | <10 | Within ±0.5 |
| Example 40 | C₆F₁₃—C₂H₄—P(O)(OH)₂ | DEGEEA/iPA | 500 | TiN | iPA | 20 | 10 | iPA | 1 | <10 | 112 | 1.2 | <10 | Within ±0.5 |
| Example 41 | C₆F₁₃—C₂H₄—P(O)(OH)₂ | DEGEEA/iPA/Water | 500 | TiN | iPA | 20 | 10 | iPA | 1 | <10 | 112 | 1.2 | <10 | Within ±0.5 |
| Example 42 | C₆F₁₃—C₂H₄—P(O)(OH)₂ | GBL/iPA | 500 | TiN | iPA | 20 | 10 | iPA | 1 | <10 | 112 | 1.2 | <10 | Within ±0.5 |
| Example 43 | C₆F₁₃—C₂H₄—P(O)(OH)₂ | GBL/iPA/Water | 500 | TiN | iPA | 20 | 10 | iPA | 1 | <10 | 112 | 1.2 | <10 | Within ±0.5 |
| Example 44 | C₆F₁₃—C₂H₄—P(O)(OH)₂ | PGDA/iPA | 500 | TiN | iPA | 20 | 10 | iPA | 1 | <10 | 112 | 1.2 | <10 | Within ±0.5 |
| Example 45 | C₆F₁₃—C₂H₄—P(O)(OH)₂ | PGDA/iPA/Water | 500 | TiN | iPA | 20 | 10 | iPA | 1 | <10 | 112 | 1.2 | <10 | Within ±0.5 |
| Example 46 | C₆F₁₃—C₂H₄—P(O)(OH)₂ | TPGDME/iPA | 500 | TiN | iPA | 20 | 10 | iPA | 1 | <10 | 112 | 1.2 | <10 | Within ±0.5 |
| Example 47 | C₆F₁₃—C₂H₄—P(O)(OH)₂ | 13BGDA/iPA | 500 | TiN | iPA | 20 | 10 | iPA | 1 | <10 | 112 | 1.2 | <10 | Within ±0.5 |
| Example 48 | C₆F₁₃—C₂H₄—P(O)(OH)₂ | 13BGDA/iPA/Water | 500 | TiN | iPA | 20 | 10 | iPA | 1 | <10 | 112 | 1.2 | <10 | Within ±0.5 |
| Example 49 | C₆F₁₃—C₂H₄—P(O)(OH)₂ | 14BGDA/iPA | 500 | TiN | iPA | 20 | 10 | iPA | 1 | <10 | 112 | 1.2 | <10 | Within ±0.5 |
| Example 50 | C₆F₁₃—C₂H₄—P(O)(OH)₂ | DPGMEA/iPA | 500 | TiN | iPA | 20 | 10 | iPA | 1 | <10 | 112 | 1.2 | <10 | Within ±0.5 |
| Example 51 | C₆F₁₃—C₂H₄—P(O)(OH)₂ | DPGMEA/iPA/Water | 500 | TiN | iPA | 20 | 10 | iPA | 1 | <10 | 112 | 1.2 | <10 | Within ±0.5 |
| Example 52 | C₆F₁₃—C₂H₄—P(O)(OH)₂ | TEGBME/iPA | 500 | TiN | iPA | 20 | 10 | iPA | 1 | <10 | 112 | 1.2 | <10 | Within ±0.5 |
| Example 53 | C₆F₁₃—C₂H₄—P(O)(OH)₂ | TEGBME/iPA/Water | 500 | TiN | iPA | 20 | 10 | iPA | 1 | <10 | 112 | 1.2 | <10 | Within ±0.5 |
| Example 54 | C₆F₁₃—C₂H₄—P(O)(OH)₂ | GBL/DPGMEA/iPA | 500 | TiN | iPA | 20 | 10 | iPA | 1 | <10 | 112 | 1.2 | <10 | Within ±0.5 |
| Example 55 | C₆F₁₃—C₂H₄—P(O)(OH)₂ | GBL/DPGMEA | 500 | TiN | iPA | 20 | 10 | iPA | 1 | <10 | 112 | 1.2 | <10 | Within ±0.5 |
| Example 56 | C₆F₁₃—C₂H₄—P(O)(OH)₂ | GBL/PGMEA/iPA | 500 | TiN | iPA | 20 | 10 | iPA | 1 | <10 | 112 | 1.2 | <10 | Within ±0.5 |
| Example 57 | C₆F₁₃—C₂H₄—P(O)(OH)₂ | GBL/PGMEA/iPA/Water | 500 | TiN | iPA | 20 | 10 | iPA | 1 | <10 | 112 | 1.2 | <10 | Within ±0.5 |
| Example 58 | C₆F₁₃—C₂H₄—P(O)(OH)₂ | DEGEEA/PGME-3 | 1000 | TiN | iPA | 20 | 10 | iPA | 1 | <10 | 112 | 1.2 | <10 | Within ±0.5 |
| Example 59 | C₆F₁₃—C₂H₄—P(O)(OH)₂ | DEGEEA/iPA | 1000 | TiN | iPA | 20 | 10 | iPA | 1 | <10 | 112 | 1.2 | <10 | Within ±0.5 |
| Example 60 | C₆F₁₃—C₂H₄—P(O)(OH)₂ | DEGEEA/iPA/Water | 1000 | TiN | iPA | 20 | 10 | iPA | 1 | <10 | 112 | 1.2 | <10 | Within ±0.5 |

TABLE 3

| | Liquid chemical for forming protecting film | | | | Cleaning liquid for pretreatment step 3 | Protecting-film-forming step | | Subsequent cleaning step | | Evaluation results | | | | |
|---|---|---|---|---|---|---|---|---|---|---|---|---|---|---|
| | Protecting-film-forming agent | Solvent | Protecting-film-forming agent concentration [mass ppm] | Wafer | | Temperature [C.°] | Time [min] | Cleaning liquid for subsequent cleaning step | Time [min] | Initial contact angle [°] | Contact angle after surface treatment ([°]) | Capillary force ([MN/m²]) <Calculated value> | Removability of protecting film (Contact angle [°]) | Surface smoothness (ΔRa [nm]) |
| Example 61 | $C_6F_{13}-C_2H_4-P(O)(OH)_2$ | DPGMEA/Water | 1000 | TiN | iPA | 20 | 10 | iPA | 1 | <10 | 112 | 1.2 | <10 | Within ±0.5 |
| Example 62 | $C_6F_{13}-C_2H_4-P(O)(OH)_2$ | TEGBME/iPA | 1000 | TiN | iPA | 20 | 10 | iPA | 1 | <10 | 112 | 1.2 | <10 | Within ±0.5 |
| Example 63 | $C_6F_{13}-C_2H_4-P(O)(OH)_2$ | TEGBME/iPA/Water | 1000 | TiN | iPA | 20 | 10 | iPA | 1 | <10 | 112 | 1.2 | <10 | Within ±0.5 |
| Example 64 | $C_6F_{13}-C_2H_4-P(O)(OH)_2$ | GBL/DPGMEA/iPA/Water | 1000 | TiN | iPA | 20 | 10 | iPA | 1 | <10 | 112 | 1.2 | <10 | Within ±0.5 |
| Example 65 | $C_6F_{13}-C_2H_4-P(O)(OH)_2$ | GBL/PGMEA/iPA/Water | 1000 | TiN | iPA | 20 | 10 | iPA | 1 | <10 | 112 | 1.2 | <10 | Within ±0.5 |
| Example 66 | $C_6F_{13}-C_2H_4-P(O)(OH)_2$ | GBL/DPGA/iPA/Water | 1000 | TiN | iPA | 20 | 10 | iPA | 1 | <10 | 112 | 1.2 | <10 | Within ±0.5 |
| Example 67 | $C_6F_{13}-C_2H_4-P(O)(OH)_2$ | GBL/13BGDA/iPA/Water | 1000 | TiN | iPA | 20 | 10 | iPA | 1 | <10 | 112 | 1.2 | <10 | Within ±0.5 |
| Example 68 | $C_6F_{13}-C_2H_4-P(O)(OH)_2$ | GBL/TEGBME iPA/Water | 1000 | TiN | iPA | 20 | 10 | iPA | 1 | <10 | 112 | 1.2 | <10 | Within ±0.5 |
| Example 69 | $C_6F_{13}-C_2H_4-P(O)(OH)_2$ | GBL/DEGEEA/iPA/Water | 1000 | TiN | iPA | 20 | 10 | iPA | 1 | <10 | 112 | 1.2 | <10 | Within ±0.5 |
| Example 70 | $C_6F_{13}-C_2H_4-P(O)(OH)_2$ | DEGEEA/iPA | 1000 | TiN | iPA | 20 | 10 | Water | 1 | <10 | 104 | 0.8 | <10 | Within ±0.5 |
| Example 71 | $C_6F_{13}-C_2H_4-P(O)(OH)_2$ | DEGEEA/PGME-10 | 1500 | TiN | iPA | 20 | 10 | iPA | 1 | <10 | 114 | 1.3 | <10 | Within ±0.5 |
| Example 72 | $C_6F_{13}-C_2H_4-P(O)(OH)_2$ | TEGDME | 100 | TiN | iPA | 20 | 10 | iPA | 1 | <10 | 108 | 1 | <10 | Within ±0.5 |
| Example 73 | $C_6F_{13}-C_2H_4-P(O)(OH)_2$ | PGMEA | 100 | TiN | iPA | 20 | 10 | iPA | 1 | <10 | 104 | 0.8 | <10 | Within ±0.5 |
| Example 74 | $C_4F_9-C_2H_4-P(O)(OH)_2$ | DEGEEA | 100 | TiN | iPA | 20 | 10 | iPA | 1 | <10 | 104 | 0.8 | <10 | Within ±0.5 |
| Example 75 | $C_6H_{13}P(O)(OH)_2$ | PGMEA | 300 | TiN | iPA | 20 | 10 | iPA | 1 | <10 | 80 | 0.6 | <10 | Within ±0.5 |
| Example 76 | $C_6H_{13}P(O)(OH)_2$ | PGMEA | 500 | TiN | iPA | 20 | 10 | iPA | 1 | <10 | 88 | 0.1 | <10 | Within ±0.5 |
| Example 77 | $C_6H_{13}P(O)(OH)_2$ | PGMEA | 1000 | TiN | iPA | 20 | 10 | iPA | 1 | <10 | 92 | 0.1 | <10 | Within ±0.5 |
| Example 78 | $C_6H_{13}P(O)(OH)_2$ | Cyclohexanone | 500 | TiN | iPA | 20 | 10 | iPA | 1 | <10 | 86 | 0.2 | <10 | Within ±0.5 |
| Example 79 | $C_6H_{13}P(O)(OH)_2$ | iPA | 500 | TiN | iPA | 20 | 10 | iPA | 1 | <10 | 64 | 1.4 | <10 | Within ±0.5 |
| Example 80 | $C_6H_{13}P(O)(OH)_2$ | PGMEA | 500 | TiN | iPA | 40 | 10 | iPA | 1 | <10 | 94 | 0.2 | <10 | Within ±0.5 |
| Example 81 | $C_6H_{13}P(O)(OH)_2$ | Water | 500 | TiN | iPA | 20 | 10 | iPA | 1 | <10 | 90 | 0 | <10 | Within ±0.5 |
| Example 82 | $C_4H_9P(O)(OH)_2$ | PGMEA | 500 | TiN | iPA | 20 | 10 | iPA | 1 | <10 | 64 | 1.4 | <10 | Within ±0.5 |
| Example 83 | $C_6H_{13}P(O)(OH)_2$ | PGMEA | 1000 | TiN | iPA | 20 | 10 | iPA | 1 | <10 | 64 | 1.4 | <10 | Within ±0.5 |
| Example 84 | $C_6H_5P(O)(OH)_2$ | PGMEA | 1000 | TiN | iPA | 20 | 10 | iPA | 1 | <10 | 62 | 1.5 | <10 | Within ±0.5 |

Incidentally, in the Table, "$C_{12}H_{25}P(O)(OH)_2$" means dodecylphosphonic acid. "$C_{10}H_{21}P(O)(OH)_2$" means decylphosphonic acid. "$C_{10}H_{21}P(O)(OC_2H_5)_2$" means diethyl decylphosphonate. "$C_8H_{17}P(O)(OH)_2$" means octylphosphonic acid. "$C_6F_{13}$—$C_2H_4$—$P(O)(OH)_2$" means perfluorohexylethylphosphonic acid. "$C_4F_9$—$C_2H_4$—$P(O)(OH)_2$" means perfluorobutylethylphosphonic acid. "$C_6H_{13}P(O)(OH)_2$" means hexylphosphonic acid. "$C_4H_9P(O)(OH)_2$" means butylphosphonic acid. "$C_6H_5P(O)(OH)_2$" means phenylphosphonic acid. Additionally, "PGME" means propylene glycol monomethyl ether. "DEGME" means diethylene glycol monomethyl ether. "DEGDEE" means diethylene glycol diethyl ether. "DEGEEA" means diethylene glycol monoethyl ether acetate. "GBL" means γ-butyrolactone. "PGDA" means propylene glycol diacetate. "TPGDME" means tripropylene glycol dimethyl ether. "13BGDA" means 1,3-butylene glycol diacetate. "14BGDA" means 1,4-butylene glycol diacetate. "DPGMEA" means dipropylene glycol monomethyl ether acetate. "TEGBME" means triethylene glycol butyl methyl ether. "TEGDME" means triethylene glycol dimethyl ether. Furthermore, "PGMEA/iPA" means a solvent obtained by combining PGMEA and iPA at a mass ratio of 99.5:0.5. Furthermore, "DEGEEA/iPA" means a solvent obtained by combining DEGEEA and iPA at a mass ratio of 99.5:0.5. "DEGEEA/iPA/water" means a solvent obtained by combining DEGEEA, iPA and water at a mass ratio of 94.9:0.1:5. "GBL/iPA" means a solvent obtained by combining GBL and iPA at a mass ratio of 95:5. "GBL/iPA/water" means a solvent obtained by combining GBL, iPA and water at a mass ratio of 95:4:1. "PGDA/iPA" means a solvent obtained by combining PGDA and iPA at a mass ratio of 99.5:0.5. "PGDA/iPA/water" means a solvent obtained by combining PGDA, iPA and water at a mass ratio of 94.9:0.1:5. "TPGDME/iPA" means a solvent obtained by combining TPGDME and iPA at a mass ratio of 99.5:0.5. "13BGDA/iPA" means a solvent obtained by combining 13BGDA and iPA at a mass ratio of 99.5:0.5. "13BGDA/iPA/water" means a solvent obtained by combining 13BGDA, iPA and water at a mass ratio of 94.9:0.1:5. "14BGDA/iPA" means a solvent obtained by combining 14BGDA and iPA at a mass ratio of 99.5:0.5. "DPGMEA/iPA" means a solvent obtained by combining DPGMEA and iPA at a mass ratio of 99.5:0.5. "DPGMEA/iPA/water" means a solvent obtained by combining DPGMEA, iPA and water at a mass ratio of 94.9:0.1:5. "TEGBME/iPA" means a solvent obtained by combining TEGBME and iPA at a mass ratio of 99.5:0.5. "TEGBME/iPA/water" means a solvent obtained by combining TEGBME, iPA and water at a mass ratio of 94.9:0.1:5. "GBL/DPGMEA/iPA" means a solvent obtained by combining GBL, DPGMEA and iPA at a mass ratio of 49.75:49.75:0.5. "GBL/DPGMEA/iPA/water" means a solvent obtained by combining GBL, DPGMEA, iPA and water at a mass ratio of 47.45:47.45:0.1:5. "GBL/PGMEA/iPA" means a solvent obtained by combining GBL, PGMEA and iPA at a mass ratio of 49.75:49.75:0.5. "GBL/PGMEA/iPA/water" means a solvent obtained by combining GBL, PGMEA, iPA and water at a mass ratio of 47.45:47.45:0.1:5. "DEGEEA/PGME-3" means a solvent obtained by combining DEGEEA and PGME at a mass ratio of 97:3. "DEGEEA/iPA-2" means a solvent obtained by combining DEGEEA and iPA at a mass ratio of 98:2. "TEGBME/iPA-2" means a solvent obtained by combining TEGBME and iPA at a mass ratio of 98:2. "GBL/DPGA/iPA/water" means a solvent obtained by combining GBL, DPGA, iPA and water at a mass ratio of 47.45:47.45:0.1:5. "GBL/13BGDA/iPA/water" means a solvent obtained by combining GBL, 13BGDA, iPA and water at a mass ratio of 47.45:47.45:0.1:5. "GBL/TEGBME/iPA/water" means a solvent obtained by combining GBL, TEGBME, iPA and water at a mass ratio of 47.45:47.45:0.1:5. "GBL/DEGEEA/iPA/water" means a solvent obtained by combining GBL, DEGEEA, iPA and water at a mass ratio of 47.45:47.45:0.1:5. "DEGEEA/PGME-10" means a solvent obtained by combining DEGEEA and PGME at a mass ratio of 90:10.

Example 85

(II-1) Preparation of Liquid Chemical for Forming Protecting Film

A mixture of 0.002 g of octadecylphosphonic acid [$C_{18}H_{37}P(O)(OH)_2$] serving as an agent for forming a water-repellent protecting film and 99.998 g of PGMEA serving as an organic solvent was stirred for about 18 hours thereby obtaining a liquid chemical for forming a protecting film, in which liquid chemical the protecting-film-forming agent concentration was 20 mass ppm.

(II-2) Step of Cleaning Wafer (Pretreatment Step)

As a pretreatment step 2, a wafer having a smooth tungsten film (a silicon wafer formed having on its surface a tungsten layer of 50 nm thickness) was immersed in 1 mass % aqueous ammonia for 1 minute at room temperature, and then immersed in pure water for 1 minute. Furthermore, as a pretreatment step 3, the wafer was immersed in iPA for 1 minute.

(II-3) From Step of Forming Protecting Film on Wafer Surface to Drying Step

As a protecting-film-forming step, the wafer having the tungsten film was immersed in the liquid chemical for forming a protecting film at 20° C. for 10 minutes, the liquid chemical having been prepared in the above "(II-1) Preparation of Liquid Chemical for forming Protecting Film" section. Thereafter, the wafer having the tungsten film was immersed in iPA for 1 minute as a subsequent cleaning step. Then, as a drying step, the wafer having the tungsten film was taken out of iPA, followed by spraying air thereon to remove iPA from the surface.

As a result of evaluating the obtained wafer having the tungsten film in a manner discussed in the above [Method for evaluating Wafer to which Liquid Chemical for forming Protecting Film is provided] section, a wafer in which an initial contact angle before the surface treatment was smaller than 10° was confirmed to have a contact angle of 68° after the surface treatment, as shown in Table 4. With this, the water-repellency-imparting effect was exhibited. Additionally, as a result of calculating the capillary force at the time of retaining water by using the equation discussed in the above "Evaluation of Capillary Force" section, the capillary force was so small as to be 1.2 $MN/m^2$. Additionally, the contact angle after UV irradiation was smaller than 10°, so that removal of the protecting film was achieved. Furthermore, the ΔRa value of the wafer after UV irradiation was within ±0.5 nm, with which it was confirmed that the wafer was not eroded at the time of cleaning and that residues of the protecting film did not remain after UV irradiation.

TABLE 4

| | Liquid chemical for forming protecting film | | | | Cleaning liquid for pretreatment step 3 | Protecting-film-forming step | | Subsequent cleaning step | | Evaluation results | | | | |
|---|---|---|---|---|---|---|---|---|---|---|---|---|---|---|
| | Protecting-film-forming agent | Solvent | Protecting-film-forming agent concentration [mass ppm] | Wafer | | Temperature [C.°] | Time [min] | Cleaning liquid for subsequent cleaning step | Time [min] | Initial contact angle [°] | Contact angle after surface treatment ([°]) | Capillary force ([MN/m²]) <Calculated value> | Removability of protecting film (Contact angle [°]) | Surface smoothness (ΔRa [nm]) |
| Example 85 | C$_{18}$H$_{37}$—P(O)(OH)$_2$ | PGMEA | 20 | W | iPA | 20 | 10 | iPA | 1 | <10 | 68 | 1.2 | <10 | Within ±0.5 |
| Example 86 | C$_{12}$H$_{25}$—P(O)(OH)$_2$ | PGMEA | 50 | W | iPA | 20 | 10 | iPA | 1 | <10 | 60 | 1.6 | <10 | Within ±0.5 |
| Example 87 | C$_{12}$H$_{25}$—P(O)(OH)$_2$ | PGMEA | 50 | W | iPA | 40 | 10 | iPA | 1 | <10 | 70 | 1.1 | <10 | Within ±0.5 |
| Example 88 | C$_{12}$H$_{25}$—P(O)(OH)$_2$ | Cyclo-hexanone | 50 | W | iPA | 40 | 10 | iPA | 1 | <10 | 70 | 1.1 | <10 | Within ±0.5 |
| Example 89 | C$_6$F$_{13}$—C$_2$H$_4$—P(O)(OH)$_2$ | PGMEA | 100 | W | iPA | 40 | 10 | iPA | 1 | <10 | 92 | 0.1 | <10 | Within ±0.5 |
| Example 90 | C$_6$F$_{13}$—C$_2$H$_4$—P(O)(OH)$_2$ | Cyclo-hexanone | 100 | W | iPA | 40 | 10 | iPA | 1 | <10 | 88 | 0.1 | <10 | Within ±0.5 |
| Example 91 | C$_6$F$_{13}$—C$_2$H$_4$—P(O)(OH)$_2$ | DEGEEA | 100 | W | iPA | 40 | 10 | iPA | 1 | <10 | 90 | 0 | <10 | Within ±0.5 |
| Example 92 | C$_6$F$_{13}$—C$_2$H$_4$—P(O)(OH)$_2$ | DEGEEA/iPA | 100 | W | iPA | 40 | 10 | iPA | 1 | <10 | 90 | 0 | <10 | Within ±0.5 |
| Example 93 | C$_6$F$_{13}$—C$_2$H$_4$—P(O)(OH)$_2$ | DEGEEA/iPA/Water | 500 | W | iPA | 40 | 10 | iPA | 1 | <10 | 92 | 0.1 | <10 | Within ±0.5 |
| Example 94 | C$_6$F$_{13}$—C$_2$H$_4$—P(O)(OH)$_2$ | PGMEA/iPA | 500 | W | iPA | 40 | 10 | iPA | 1 | <10 | 92 | 0.1 | <10 | Within ±0.5 |
| Example 95 | C$_6$F$_{13}$—C$_2$H$_4$—P(O)(OH)$_2$ | DEGEEA/iPA | 500 | W | iPA | 40 | 10 | iPA | 1 | <10 | 92 | 0.1 | <10 | Within ±0.5 |
| Example 96 | C$_6$F$_{13}$—C$_2$H$_4$—P(O)(OH)$_2$ | GBL/iPA | 500 | W | iPA | 40 | 10 | iPA | 1 | <10 | 92 | 0.1 | <10 | Within ±0.5 |
| Example 97 | C$_6$F$_{13}$—C$_2$H$_4$—P(O)(OH)$_2$ | GBL/iPA/Water | 500 | W | iPA | 40 | 10 | iPA | 1 | <10 | 92 | 0.1 | <10 | Within ±0.5 |
| Example 98 | C$_6$F$_{13}$—C$_2$H$_4$—P(O)(OH)$_2$ | PGDA/iPA | 500 | W | iPA | 40 | 10 | iPA | 1 | <10 | 92 | 0.1 | <10 | Within ±0.5 |
| Example 99 | C$_6$F$_{13}$—C$_2$H$_4$—P(O)(OH)$_2$ | TPGDME/iPA | 500 | W | iPA | 40 | 10 | iPA | 1 | <10 | 92 | 0.1 | <10 | Within ±0.5 |
| Example 100 | C$_6$F$_{13}$—C$_2$H$_4$—P(O)(OH)$_2$ | 13BGDA/iPA | 500 | W | iPA | 40 | 10 | iPA | 1 | <10 | 92 | 0.1 | <10 | Within ±0.5 |
| Example 101 | C$_6$F$_{13}$—C$_2$H$_4$—P(O)(OH)$_2$ | 14BGDA/iPA | 500 | W | iPA | 40 | 10 | iPA | 1 | <10 | 92 | 0.1 | <10 | Within ±0.5 |
| Example 102 | C$_6$F$_{13}$—C$_2$H$_4$—P(O)(OH)$_2$ | DPGMEA/iPA | 500 | W | iPA | 40 | 10 | iPA | 1 | <10 | 92 | 0.1 | <10 | Within ±0.5 |
| Example 103 | C$_6$F$_{13}$—C$_2$H$_4$—P(O)(OH)$_2$ | DPGMEA/iPA/Water | 500 | W | iPA | 40 | 10 | iPA | 1 | <10 | 92 | 0.1 | <10 | Within ±0.5 |
| Example 104 | C$_6$F$_{13}$—C$_2$H$_4$—P(O)(OH)$_2$ | TEGBME/iPA | 500 | W | iPA | 40 | 10 | iPA | 1 | <10 | 92 | 0.1 | <10 | Within ±0.5 |
| Example 105 | C$_6$F$_{13}$—C$_2$H$_4$—P(O)(OH)$_2$ | DEGEEA/iPA | 1000 | W | iPA | 20 | 10 | iPA | 1 | <10 | 94 | 0.2 | <10 | Within ±0.5 |
| Example 106 | C$_6$F$_{13}$—C$_2$H$_4$—P(O)(OH)$_2$ | DEGEEA/iPA/Water | 1000 | W | iPA | 20 | 10 | iPA | 1 | <10 | 94 | 0.2 | <10 | Within ±0.5 |
| Example 107 | C$_6$F$_{13}$—C$_2$H$_4$—P(O)(OH)$_2$ | GBL/DEGEEA/iPA/Water | 1000 | W | iPA | 20 | 10 | iPA | 1 | <10 | 94 | 0.2 | <10 | Within ±0.5 |
| Example 108 | C$_6$F$_{13}$—C$_2$H$_4$—P(O)(OH)$_2$ | GBL/DPGMEA/iPA/Water | 1000 | W | iPA | 20 | 10 | iPA | 1 | <10 | 94 | 0.2 | <10 | Within ±0.5 |
| Example 109 | C$_6$F$_{13}$—C$_2$H$_4$—P(O)(OH)$_2$ | GBL/PGMEA/iPA/Water | 1000 | W | iPA | 20 | 10 | iPA | 1 | <10 | 94 | 0.2 | <10 | Within ±0.5 |

Examples 86 to 109

Upon suitably modifying those used in Example 85 (i.e., the protecting-film-forming agent, the solvent, the protecting-film-forming agent concentration, and the temperature of the protecting-film-forming step), the surface treatment was conducted on a wafer. Then, evaluations were performed thereon. The results are shown in Table 4.

Example 110

(III-1) Preparation of Liquid Chemical for Forming Protecting Film

A mixture of 0.002 g of octadecylphosphonic acid $[C_{18}H_{37}P(O)(OH)_2]$ serving as an agent for forming a water-repellent protecting film and 99.998 g of PGMEA serving as an organic solvent was stirred for about 18 hours thereby obtaining a liquid chemical for forming a protecting film, in which liquid chemical the protecting-film-forming agent concentration was 20 mass ppm.

(III-2) Step of Cleaning Wafer (Pretreatment Step)

As a pretreatment step 2, a wafer having a smooth ruthenium film (a silicon wafer formed having on its surface a ruthenium layer of 300 nm thickness) was immersed in 1 mass % aqueous ammonia for 1 minute at room temperature, and then immersed in pure water for 1 minute. Furthermore, as a pretreatment step 3, the wafer was immersed in iPA for 1 minute.

(III-3) From Step of Forming Protecting Film on Wafer Surface to Drying Step As a protecting-film-forming step, the wafer having the ruthenium film was immersed in the liquid chemical for forming a protecting film at 20° C. for 10 minutes, the liquid chemical having been prepared in the above "(III-1) Preparation of Liquid Chemical for forming Protecting Film" section. Thereafter, the wafer having the ruthenium film was immersed in iPA for 1 minute as a subsequent cleaning step. Then, as a drying step, the wafer having the ruthenium film was taken out of iPA, followed by spraying air thereon to remove iPA from the surface.

As a result of evaluating the obtained wafer having the ruthenium film in a manner discussed in the above [Method for evaluating Wafer to which Liquid Chemical for forming Protecting Film is provided] section, a wafer in which an initial contact angle before the surface treatment was smaller than 10° was confirmed to have a contact angle of 72° after the surface treatment, as shown in Table 5. With this, the water-repellency-imparting effect was exhibited. Additionally, as a result of calculating the capillary force at the time of retaining water by using the equation discussed in the above "Evaluation of Capillary Force" section, the capillary force was so small as to be 1.0 $MN/m^2$. Additionally, the contact angle after UV irradiation was smaller than 10°, so that removal of the protecting film was achieved. Furthermore, the ΔRa value of the wafer after UV irradiation was within ±0.5 nm, with which it was confirmed that the wafer was not eroded at the time of cleaning and that residues of the protecting film did not remain after UV irradiation.

TABLE 5

| | Liquid chemical for forming protecting film | | | Cleaning liquid for pretreatment step 3 | Protecting-film-forming step | | Subsequent cleaning step | | Evaluation results | | | | |
|---|---|---|---|---|---|---|---|---|---|---|---|---|---|
| | Protecting-film-forming agent | Solvent | Protecting-film-forming agent concentration [mass ppm] | | Temperature [C.°] | Time [min] | Cleaning liquid for subsequent cleaning step | Time [min] | Initial contact angle [°] | Contact angle after surface treatment [°] | Capillary force ([MN/m²]) <Calculated value> | Removability of protecting film (Contact angle [°]) | Surface smoothness (ΔRa [nm]) |
| | | | | Wafer | | | | | | | | | |
| Example 110 | C$_{18}$H$_{37}$P(O)(OH)$_2$ | PGMEA | 20 | Ru | iPA | 20 | 10 | iPA | 1 | <10 | 72 | 1 | <10 | Within ±0.5 |
| Example 111 | C$_{12}$H$_{25}$P(O)(OH)$_2$ | PGMEA | 50 | Ru | iPA | 20 | 10 | iPA | 1 | <10 | 64 | 1.4 | <10 | Within ±0.5 |
| Example 112 | C$_{12}$H$_{25}$P(O)(OH)$_2$ | PGMEA | 50 | Ru | iPA | 40 | 10 | iPA | 1 | <10 | 66 | 1.3 | <10 | Within ±0.5 |
| Example 113 | C$_{12}$H$_{25}$P(O)(OH)$_2$ | Cyclohexanone | 50 | Ru | iPA | 40 | 10 | iPA | 1 | <10 | 74 | 0.9 | <10 | Within ±0.5 |
| Example 114 | C$_{12}$H$_{25}$P(O)(OH)$_2$ | Water | 20 | Ru | iPA | 40 | 10 | iPA | 1 | <10 | 70 | 1.1 | <10 | Within ±0.5 |
| Example 115 | C$_6$F$_{13}$—C$_2$H$_4$—P(O)(OH)$_2$ | PGMEA | 100 | Ru | iPA | 40 | 10 | iPA | 1 | <10 | 96 | 0.3 | <10 | Within ±0.5 |
| Example 116 | C$_6$F$_{13}$—C$_2$H$_4$—P(O)(OH)$_2$ | Cyclohexanone | 100 | Ru | iPA | 40 | 10 | iPA | 1 | <10 | 90 | 0 | <10 | Within ±0.5 |
| Example 117 | C$_6$F$_{13}$—C$_2$H$_4$—P(O)(OH)$_2$ | Water | 100 | Ru | iPA | 40 | 10 | iPA | 1 | <10 | 92 | 0.1 | <10 | Within ±0.5 |
| Example 118 | C$_6$F$_{13}$—C$_2$H$_4$—P(O)(OH)$_2$ | DEGEEA | 100 | Ru | iPA | 40 | 10 | iPA | 1 | <10 | 92 | 0.1 | <10 | Within ±0.5 |
| Example 119 | C$_6$F$_{13}$—C$_2$H$_4$—P(O)(OH)$_2$ | DEGEEA/iPA | 100 | Ru | iPA | 40 | 10 | iPA | 1 | <10 | 92 | 0.1 | <10 | Within ±0.5 |
| Example 120 | C$_6$F$_{13}$—C$_2$H$_4$—P(O)(OH)$_2$ | PGMEA/iPA | 500 | Ru | iPA | 40 | 10 | iPA | 1 | <10 | 96 | 0.3 | <10 | Within ±0.5 |
| Example 121 | C$_6$F$_{13}$—C$_2$H$_4$—P(O)(OH)$_2$ | DEGEEA/iPA | 500 | Ru | iPA | 40 | 10 | iPA | 1 | <10 | 96 | 0.3 | <10 | Within ±0.5 |
| Example 122 | C$_6$F$_{13}$—C$_2$H$_4$—P(O)(OH)$_2$ | DEGEEA/iPA/Water | 500 | Ru | iPA | 40 | 10 | iPA | 1 | <10 | 96 | 0.3 | <10 | Within ±0.5 |
| Example 123 | C$_6$F$_{13}$—C$_2$H$_4$—P(O)(OH)$_2$ | GBL/iPA | 500 | Ru | iPA | 40 | 10 | iPA | 1 | <10 | 96 | 0.3 | <10 | Within ±0.5 |
| Example 124 | C$_6$F$_{13}$—C$_2$H$_4$—P(O)(OH)$_2$ | GBL/iPA/Water | 500 | Ru | iPA | 40 | 10 | iPA | 1 | <10 | 96 | 0.3 | <10 | Within ±0.5 |
| Example 125 | C$_6$F$_{13}$—C$_2$H$_4$—P(O)(OH)$_2$ | PGDA/iPA | 500 | Ru | iPA | 40 | 10 | iPA | 1 | <10 | 96 | 0.3 | <10 | Within ±0.5 |
| Example 126 | C$_6$F$_{13}$—C$_2$H$_4$—P(O)(OH)$_2$ | TPGDME/iPA | 500 | Ru | iPA | 40 | 10 | iPA | 1 | <10 | 96 | 0.3 | <10 | Within ±0.5 |
| Example 127 | C$_6$F$_{13}$—C$_2$H$_4$—P(O)(OH)$_2$ | 13BGDA/iPA | 500 | Ru | iPA | 40 | 10 | iPA | 1 | <10 | 96 | 0.3 | <10 | Within ±0.5 |
| Example 128 | C$_6$F$_{13}$—C$_2$H$_4$—P(O)(OH)$_2$ | 14BGDA/iPA | 500 | Ru | iPA | 40 | 10 | iPA | 1 | <10 | 96 | 0.3 | <10 | Within ±0.5 |
| Example 129 | C$_6$F$_{13}$—C$_2$H$_4$—P(O)(OH)$_2$ | DPGMEA/iPA | 500 | Ru | iPA | 40 | 10 | iPA | 1 | <10 | 96 | 0.3 | <10 | Within ±0.5 |
| Example 130 | C$_6$F$_{13}$—C$_2$H$_4$—P(O)(OH)$_2$ | DPGMEA/iPA/Water | 500 | Ru | iPA | 40 | 10 | iPA | 1 | <10 | 96 | 0.3 | <10 | Within ±0.5 |
| Example 131 | C$_6$F$_{13}$—C$_2$H$_4$—P(O)(OH)$_2$ | TEGBME/iPA | 500 | Ru | iPA | 40 | 10 | iPA | 1 | <10 | 96 | 0.3 | <10 | Within ±0.5 |
| Example 132 | C$_6$F$_{13}$—C$_2$H$_4$—P(O)(OH)$_2$ | DEGEEA/iPA | 1000 | Ru | iPA | 40 | 10 | iPA | 1 | <10 | 98 | 0.4 | <10 | Within ±0.5 |
| Example 133 | C$_6$F$_{13}$—C$_2$H$_4$—P(O)(OH)$_2$ | DEGEEA/iPA/Water | 1000 | Ru | iPA | 40 | 10 | iPA | 1 | <10 | 98 | 0.4 | <10 | Within ±0.5 |
| Example 134 | C$_6$F$_{13}$—C$_2$H$_4$—P(O)(OH)$_2$ | GBL/DEGEEA/iPA/Water | 1000 | Ru | iPA | 40 | 10 | iPA | 1 | <10 | 98 | 0.4 | <10 | Within ±0.5 |
| Example 135 | C$_6$F$_{13}$—C$_2$H$_4$—P(O)(OH)$_2$ | GBL/DPGMEA/iPA/Water | 1000 | Ru | iPA | 40 | 10 | iPA | 1 | <10 | 98 | 0.4 | <10 | Within ±0.5 |
| Example 136 | C$_6$F$_{13}$—C$_2$H$_4$—P(O)(OH)$_2$ | GBL/PGMEA/iPA/Water | 1000 | Ru | iPA | 40 | 10 | iPA | 1 | <10 | 98 | 0.4 | <10 | Within ±0.5 |

Examples 111 to 136

Upon suitably modifying those used in Example 110 (i.e., the protecting-film-forming agent, the solvent, the protecting-film-forming agent concentration, and the temperature of the protecting-film-forming step), the surface treatment was conducted on a wafer. Then, evaluations were performed thereon. The results are shown in Table 5.

Comparative Example 1

The procedure of Example 1 was repeated with the exception that the liquid chemical for forming a protecting film was not provided to the wafer having the titanium nitride film. In other words, the present Comparative Example was such as to evaluate a wafer the surface of which was not coated with the protecting film. From the evaluation results shown in Table 6, it was confirmed that the contact angle on the wafer was so small as to be 14° and that the capillary force at the time of retaining water was so large as to be 3.1 $MN/m^2$.

TABLE 6

| | Liquid chemical for forming protecting film | | | | | Protecting-film-forming step | |
|---|---|---|---|---|---|---|---|
| | Protecting-film-forming agent | Solvent | Protecting-film-forming agent concentration [mass ppm] | Wafer | Cleaning liquid for pretreatment step 3 | Temperature [C.°] | Time [min] |
| Comparative Example 1 | — | — | — | TiN | iPA | — | — |
| Comparative Example 2 | $(CH_3)_3SiCl$ | Toluene | 30000 | TiN | iPA | 20 | 10 |
| Comparative Example 3 | $[(CH_3)_3Si]_2NH$ | Toluene | 30000 | TiN | iPA | 20 | 10 |
| Comparative Example 4 | $(CH_3)_3SiN(CH_3)_2$ | Toluene | 30000 | TiN | iPA | 20 | 10 |
| Comparative Example 5 | — | — | — | W | iPA | — | — |
| Comparative Example 6 | $(CH_3)_3SiCl$ | Toluene | 30000 | W | iPA | 20 | 10 |
| Comparative Example 7 | $[(CH_3)_3Si]_2NH$ | Toluene | 30000 | W | iPA | 20 | 10 |
| Comparative Example 8 | $(CH_3)_3SiN(CH_3)_2$ | Toluene | 30000 | W | iPA | 20 | 10 |
| Comparative Example 9 | — | — | — | Ru | iPA | — | — |
| Comparative Example 10 | $(CH_3)_3SiCl$ | Toluene | 30000 | Ru | iPA | 20 | 10 |
| Comparative Example 11 | $[(CH_3)_3Si]_2NH$ | Toluene | 30000 | Ru | iPA | 20 | 10 |
| Comparative Example 12 | $(CH_3)_3SiN(CH_3)_2$ | Toluene | 30000 | Ru | iPA | 20 | 10 |

| | Subsequent cleaning step | | Evaluation results | | | | |
|---|---|---|---|---|---|---|---|
| | Cleaning liquid for subsequent cleaning step | Time [min] | Initial contact angle [°] | Contact angle after surface treatment ([°]) | Capillary force ([$MN/m^2$]) <Calculated value> | Removability of protecting film (Contact angle [°]) | Surface smoothness ($\Delta Ra$[nm]) |
| Comparative Example 1 | iPA | 1 | <10 | 14 | 3.1 | — | — |
| Comparative Example 2 | iPA | 1 | <10 | 18 | 3 | — | — |
| Comparative Example 3 | iPA | 1 | <10 | 20 | 3 | — | — |
| Comparative Example 4 | iPA | 1 | <10 | 20 | 3 | — | — |
| Comparative Example 5 | iPA | 1 | <10 | 14 | 3.1 | — | — |
| Comparative Example 6 | iPA | 1 | <10 | 14 | 3.1 | — | — |
| Comparative Example 7 | iPA | 1 | <10 | 8 | 3.2 | — | — |
| Comparative Example 8 | iPA | 1 | <10 | 10 | 3.2 | — | — |
| Comparative Example 9 | iPA | 1 | <10 | 14 | 3.1 | — | — |

TABLE 6-continued

| | | | | | | | |
|---|---|---|---|---|---|---|---|
| Comparative Example 10 | iPA | 1 | <10 | 14 | 3.1 | — | — |
| Comparative Example 11 | iPA | 1 | <10 | 20 | 3 | — | — |
| Comparative Example 12 | iPA | 1 | <10 | 22 | 3 | — | — |

Comparative Example 2

First of all, a mixture of 3 g of trimethylsilyl chloride [(CH$_3$)$_3$SiCl] (a silane coupling agent) serving as a protecting-film-forming agent and 97 g of toluene serving as a solvent was stirred for about 5 minutes thereby obtaining a liquid chemical for forming a protecting film, in which liquid chemical the protecting-film-forming agent concentration was 30000 mass ppm. Then, the cleaning and the surface treatment were conducted on a wafer having a titanium nitride film by the same method as Example 1. From the evaluation results as shown in Table 6, it was confirmed that the contact angle on the wafer after the surface treatment was 18°. The water-repellency-imparting effect was not observed. Additionally, the capillary force at the time of retaining water was so large as to be 3.0 MN/m$^2$.

Comparative Example 3

The procedure of Comparative Example 2 was repeated with the exception that hexamethyldisilazane ([(CH$_3$)$_3$Si]$_2$NH) was used as the protecting-film-forming agent. From the results as shown in Table 6, it was confirmed that the contact angle after the surface treatment was 20°. The water-repellency-imparting effect was not observed. Additionally, the capillary force at the time of retaining water was so large as to be 3.0 MN/m$^2$.

Comparative Example 4

The procedure of Comparative Example 2 was repeated with the exception that trimethylsilyl dimethylamine [(CH$_3$)$_3$SiN(CH$_3$)$_2$] was used as the protecting-film-forming agent. From the results as shown in Table 6, it was confirmed that the contact angle after the surface treatment was 20°. The water-repellency-imparting effect was not observed. Additionally, the capillary force at the time of retaining water was so large as to be 3.0 MN/m$^2$.

Comparative Example 5

The procedure of Example 85 was repeated with the exception that the liquid chemical for forming a protecting film was not provided to the wafer having the tungsten film. In other words, the present Comparative Example was such as to evaluate a wafer the surface of which was not coated with the protecting film. From the evaluation results shown in Table 6, it was confirmed that the contact angle on the wafer was so small as to be 14° and that the capillary force at the time of retaining water was so large as to be 3.1 MN/m$^2$.

Comparative Example 6

First of all, a mixture of 3 g of trimethylsilyl chloride [(CH$_3$)$_3$SiCl] (a silane coupling agent) serving as a protecting-film-forming agent and 97 g of toluene serving as a solvent was stirred for about 5 minutes thereby obtaining a liquid chemical for forming a protecting film, in which liquid chemical the protecting-film-forming agent concentration was 30000 mass ppm. Then, the cleaning and the surface treatment were conducted on a wafer having a tungsten film by the same method as Example 85. From the evaluation results as shown in Table 6, it was confirmed that the contact angle after the surface treatment was 14°. The water-repellency-imparting effect was not observed. Additionally, the capillary force at the time of retaining water was so large as to be 3.1 MN/m$^2$.

Comparative Example 7

The procedure of Comparative Example 6 was repeated with the exception that hexamethyldisilazane ([(CH$_3$)$_3$Si]$_2$NH) was used as the protecting-film-forming agent. From the evaluation results as shown in Table 6, it was confirmed that the contact angle after the surface treatment was 8°. The water-repellency-imparting effect was not observed. Additionally, the capillary force at the time of retaining water was so large as to be 3.2 MN/m$^2$.

Comparative Example 8

The procedure of Comparative Example 6 was repeated with the exception that trimethylsilyl dimethylamine [(CH$_3$)$_3$SiN(CH$_3$)$_2$] was used as the protecting-film-forming agent. From the evaluation results as shown in Table 6, it was confirmed that the contact angle after the surface treatment was 10°. The water-repellency-imparting effect was not observed. Additionally, the capillary force at the time of retaining water was so large as to be 3.2 MN/m$^2$.

Comparative Example 9

The procedure of Example 110 was repeated with the exception that the liquid chemical for forming a protecting film was not provided to the wafer having the ruthenium film. In other words, the present Comparative Example was such as to evaluate a wafer the surface of which was not coated with the protecting film. From the evaluation results shown in Table 6, it was confirmed that the contact angle on the wafer was so small as to be 14° and that the capillary force at the time of retaining water was so large as to be 3.1 MN/m$^2$.

Comparative Example 10

First of all, a mixture of 3 g of trimethylsilyl chloride [(CH$_3$)$_3$SiCl] (a silane coupling agent) serving as a protecting-film-forming agent and 97 g of toluene serving as a solvent was stirred for about 5 minutes thereby obtaining a liquid chemical for forming a protecting film, in which liquid chemical the protecting-film-forming agent concentration was 30000 mass ppm. Then, the cleaning and the surface treatment were conducted on a wafer having a ruthenium film by the same method as Example 110. From the evaluation results as shown in Table 6, it was confirmed that the contact angle after the surface treatment was 14°. The water-repellency-imparting effect was not observed. Additionally, the capillary force at the time of retaining water was so large as to be 3.1 MN/m².

Comparative Example 11

The procedure of Comparative Example 10 was repeated with the exception that hexamethyldisilazane ([(CH$_3$)$_3$Si]$_2$NH) was used as the protecting-film-forming agent. From the evaluation results as shown in Table 6, it was confirmed that the contact angle after the surface treatment was 20°. The water-repellency-imparting effect was not observed. Additionally, the capillary force at the time of retaining water was so large as to be 3.0 MN/m².

Comparative Example 12

The procedure of Comparative Example 10 was repeated with the exception that trimethylsilyl dimethylamine [(CH$_3$)$_3$SiN(CH$_3$)$_2$] was used as the protecting-film-forming agent. From the evaluation results as shown in Table 6, it was confirmed that the contact angle after the surface treatment was 22°. The water-repellency-imparting effect was not observed. Additionally, the capillary force at the time of retaining water was so large as to be 3.0 MN/m².

EXPLANATION OF REFERENCE NUMERALS

1 Wafer
2 Uneven pattern of a surface of the wafer
3 Projected portions of the pattern
4 Recessed portions of the pattern
5 Width of the recessed portions
6 Height of the projected portions
7 Width of the projected portions
8 Liquid chemical for forming a protecting film, retained in the recessed portions 4
9 Liquid retained in the recessed portions 4
10 Protecting Film

What is claimed is:

1. A method for cleaning a wafer, the wafer having at its surface an uneven pattern and containing at least one kind element of titanium, tungsten, aluminum, copper, tin, tantalum and ruthenium at surfaces of recessed portions of the uneven pattern, the method comprising:
a) a protecting-film-forming step where a liquid chemical for forming a protecting film is retained at least in the recessed portions of the uneven pattern;
b) a drying step of removing liquid from the uneven pattern by drying; and
c) a film-removing step of removing the protecting film, wherein the liquid chemical for forming a protecting film is a liquid chemical comprising an agent for forming a water-repellent protecting film, and
the agent is
a compound represented by the general formula [1]

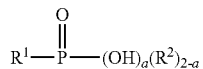

wherein
R$^1$ represents a C$_1$-C$_{18}$ monovalent hydrocarbon group, the hydrogen elements of which may be partially or entirely replaced with one or more fluorine atoms;
R$^2$ mutually independently represents a monovalent organic group having a C$_1$-C$_{18}$ hydrocarbon group, the hydrogen elements of which may be partially or entirely replaced with one or more fluorine atoms;
a represents an integer from 0 to 2; and
wherein the agent forms a water-repellent protecting film at least on the surfaces of the recessed portions.

2. A method for cleaning a wafer, comprising the steps of:
a) cleaning a wafer having at its surface an uneven pattern and containing at least one kind element of titanium, tungsten, aluminum, copper, tin, tantalum and ruthenium at surfaces of recessed portions of the uneven pattern;
b) thereafter retaining a liquid chemical at least in the recessed portions of the uneven pattern to form a water-repellent protecting film at least on the surfaces of the recessed portions; and
c) thereafter drying the wafer,
wherein the liquid chemical comprises a solvent and an agent for forming a water-repellent protecting film, and the agent is a compound represented by the following general formula [1]

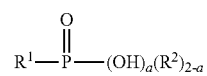

wherein
R$^1$ represents a C$_1$-C$_{18}$ monovalent hydrocarbon group, the hydrogen elements of which may be partially or entirely replaced with one or more fluorine atoms;
R$^2$ mutually independently represents a monovalent organic group having a C$_1$-C$_{18}$ hydrocarbon group, the hydrogen elements of which may be partially or entirely replaced with one or more fluorine atoms;
a represents an integer from 0 to 2.

3. A method for cleaning a wafer, as claimed in claim 2, wherein the agent for forming a water-repellent protecting film is a compound represented by the following general formula [2]

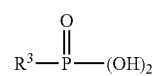

wherein R$^3$ represents a C$_1$-C$_{18}$ monovalent hydrocarbon group, the hydrogen elements of which may be partially or entirely replaced with one or more fluorine atoms.

4. A method for cleaning a wafer, as claimed in claim 2, wherein the water-repellent protecting film is formed from the compound serving as the agent for forming a water-repellent protecting film and represented by the general formula [1].

5. A method for cleaning a wafer, as claimed in claim 2, wherein the step of retaining the liquid chemical at least in the recessed portions of the uneven pattern to form a water-repellent protecting film at least on the surfaces of the recessed portions is carried out after the step of cleaning the wafer by substituting a cleaning liquid with the liquid chemical.

6. A method for cleaning a wafer, as claimed in claim 2, further comprising the steps of:
   a pretreatment step 1 of making a wafer surface into a surface having an uneven pattern; and
   at least one of a pretreatment step 2 of cleaning the wafer surface by using a water-based cleaning liquid and a pretreatment step 3 of substituting the water-based cleaning liquid with a cleaning liquid A different from the water-based cleaning liquid,
   wherein the pretreatment steps 1 to 3 are performed before the step of surface treatment using the liquid chemical.

7. A method for cleaning a wafer, as claimed in claim 6, wherein the water-based cleaning liquid used in the pretreatment step 2 are selected from the group consisting of water and an aqueous solution obtained by mixing at least one kind of an organic solvent, hydrogen peroxide, ozone, acid, alkali and surfactant with water, the aqueous solution having a water content of not less than 10 mass%.

8. A method for cleaning a wafer, as claimed in claim 6, wherein the cleaning liquid A used in the pretreatment step 3 is selected from the group consisting of: an organic solvent; a mixture of an organic solvent and a water-based cleaning liquid; and a cleaning liquid obtained by mixing at least one kind of acid, alkali and a surfactant into the organic solvent or the mixture of an organic solvent and a water-based cleaning liquid.

9. A method for cleaning a wafer, as claimed in claim 2, wherein the style for cleaning the wafer are selected from the group consisting of a single cleaning style and a batch style.

10. A method for cleaning a wafer, as claimed in claim 9, wherein the single cleaning style comprises spin cleaning.

11. A method for cleaning a wafer, as claimed in claim 9, wherein the batch style is performed by cleaning a plurality of wafer sheets while immersing them in a cleaning bath.

12. A method for cleaning a wafer, as claimed in claim 6, wherein the liquid chemical and the cleaning liquid each are supplied in at least one form of liquid and vapor.

13. A method for cleaning a wafer, as claimed in claim 2, wherein the liquid chemical has a temperature of not lower than 10° C. and lower than the boiling point of the liquid chemical.

14. A method for cleaning a wafer, as claimed in claim 2, further comprising:
   a subsequent cleaning step where the liquid chemical that remains at least in the recessed portions of the uneven pattern is substituted with a cleaning liquid B different from the liquid chemical,
   wherein the subsequent cleaning step is performed after the step of forming a water-repellent protecting film and before the drying step.

15. A method for cleaning a wafer, as claimed in claim 14, wherein the cleaning liquid B comprises at least one selected from the group consisting of hydrocarbons, esters, ethers, ketones, halogen-element containing solvents, sulfoxide-based solvents, alcohols, polyalcohol derivatives and nitrogen element-containing solvents.

16. A method for cleaning a wafer, as claimed in claim 14, wherein a time to retain the cleaning liquid B during the subsequent cleaning step is not shorter than 10 seconds.

17. A method for cleaning a wafer, as claimed in claim 2, wherein the drying step is conducted by at least one selected from the group consisting of spin drying, 2 propanol steam drying, Marangoni drying, heating drying, warm air drying and vacuum drying.

18. A method for cleaning a wafer, as claimed in claim 2, further comprising:
   removing the water-repellent protecting film after the drying step.

19. A method for cleaning a wafer, as claimed in claim 18, wherein the step of removing the water-repellant protecting film is conducted by at least one of: a method of irradiating the wafer surface with light; a method of heating the wafer; a method of exposing the wafer to ozone; a method of irradiating the wafer surface with plasma; and a method of subjecting the wafer surface to corona discharge.

20. A method for cleaning a wafer, as claimed in claim 19, wherein the method of irradiating the wafer surface is performed with ultraviolet rays having a wavelength of shorter than 340 nm.

21. A method for cleaning a wafer, as claimed in claim 19, wherein the method of heating the wafer is performed at 400 to 1000° C. for 10 seconds to 60 minutes.

\* \* \* \* \*